(12) United States Patent
Pellon

(10) Patent No.: US 7,504,976 B1
(45) Date of Patent: Mar. 17, 2009

(54) DIRECT RADIO FREQUENCY GENERATION USING POWER DIGITAL-TO-ANALOG CONVERSION

(75) Inventor: Leopold E. Pellon, Hainesport, NJ (US)

(73) Assignee: Lockheed Martin Corporation, Bethesda, MD (US)

( * ) Notice: Subject to any disclaimer, the term of this patent is extended or adjusted under 35 U.S.C. 154(b) by 0 days.

(21) Appl. No.: 11/700,382

(22) Filed: Jan. 31, 2007

(51) Int. Cl.
*H03M 3/00* (2006.01)
(52) U.S. Cl. ............................ 341/143; 341/144
(58) Field of Classification Search ............... 341/143, 341/144
See application file for complete search history.

(56) References Cited

U.S. PATENT DOCUMENTS

| | | | | |
|---|---|---|---|---|
| 3,521,170 A | * | 7/1970 | Leuthold et al. | ............ 341/143 |
| 4,291,286 A | * | 9/1981 | Wagner | ............ 333/166 |
| 4,584,541 A | | 4/1986 | Nossen | |
| 4,628,286 A | | 12/1986 | Nossen | |
| 5,323,157 A | * | 6/1994 | Ledzius et al. | ............ 341/143 |
| 5,353,309 A | * | 10/1994 | Agazzi et al. | ............ 341/143 |
| 5,590,155 A | * | 12/1996 | Yasuda | ............ 375/261 |
| 6,067,327 A | * | 5/2000 | Creigh et al. | ............ 341/144 |
| 7,116,253 B2 | * | 10/2006 | Norsworthy et al. | ........ 341/127 |

\* cited by examiner

*Primary Examiner*—Howard Williams
(74) *Attorney, Agent, or Firm*—Duane Morris LLP

(57) ABSTRACT

An RF signal source receives wideband digital signals representing the instantaneous amplitude of the desired RF, and $\Sigma\Delta$ converts to ternary $\Sigma\Delta$ signals. The ternary $\Sigma\Delta$ signals are delayed in a transversal filter and the delayed signals are converted to currents for application to a traveling-wave summer for producing the desired RF. The traveling-wave summer may be a transmission line. The currents may be weighted with a filter response in order to limit the bandwidth of the RF signals. The RF may be coupled out through an antialiasing filter. The digital clocks may be delayed to correspond with the delays of the combiner, to impart directionality to the summed signals.

22 Claims, 21 Drawing Sheets

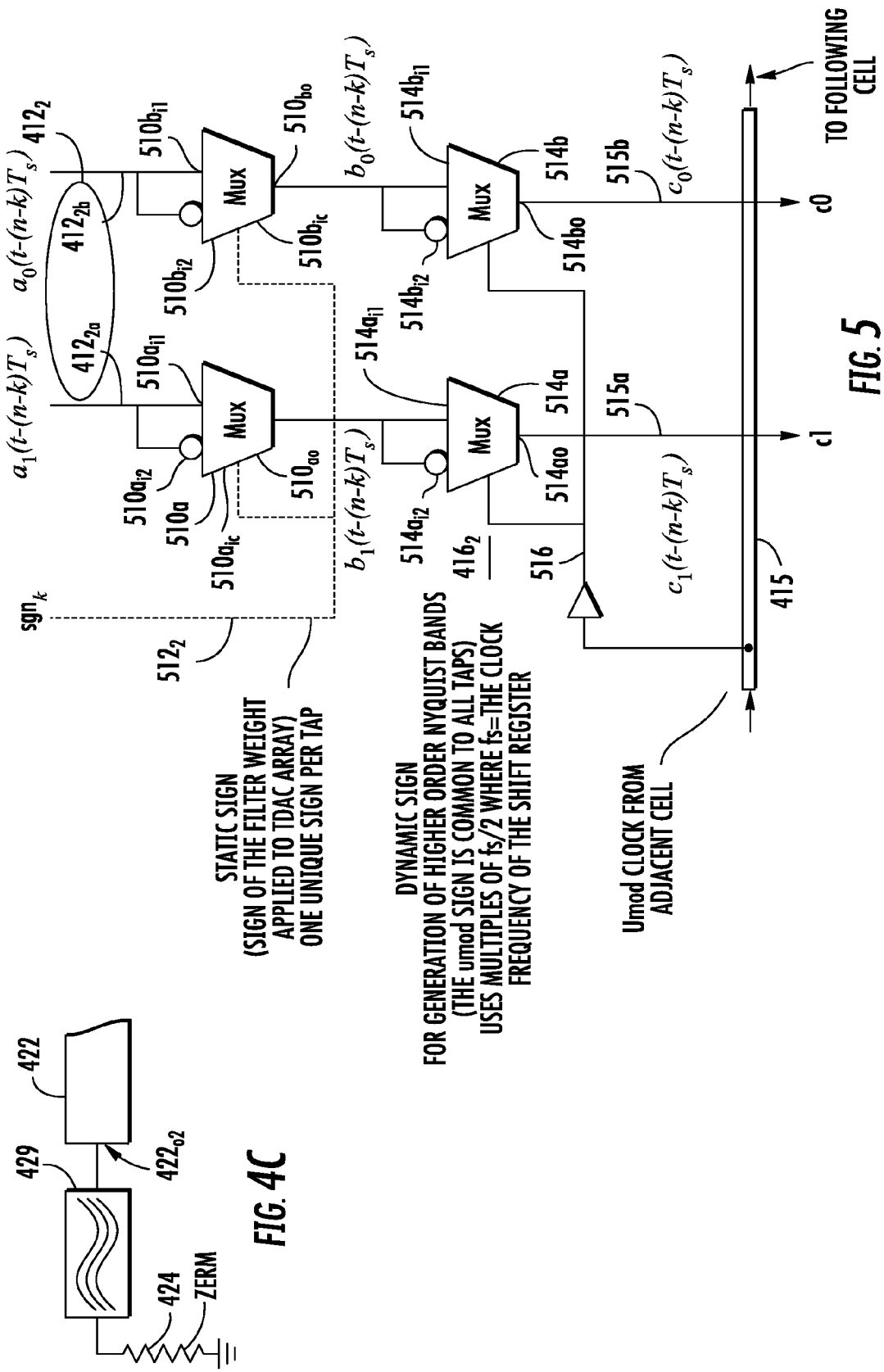

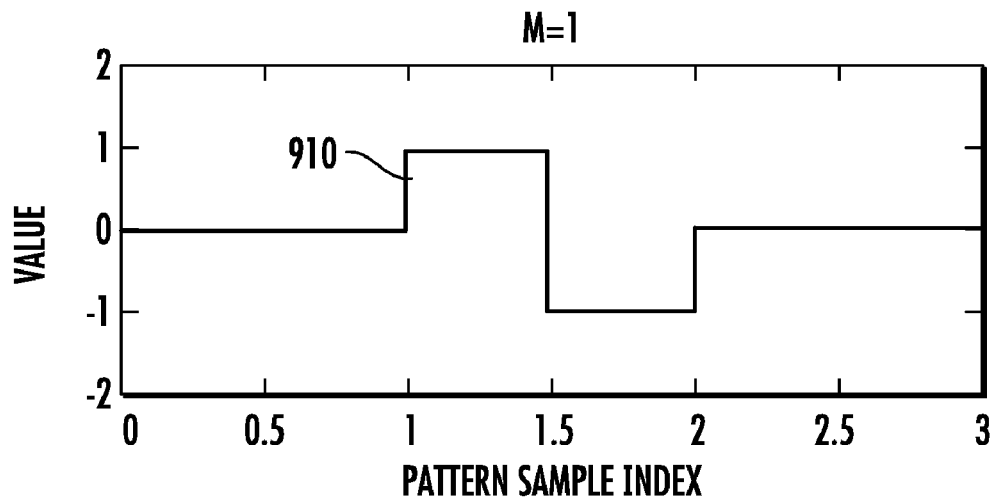
FIG. 9A1
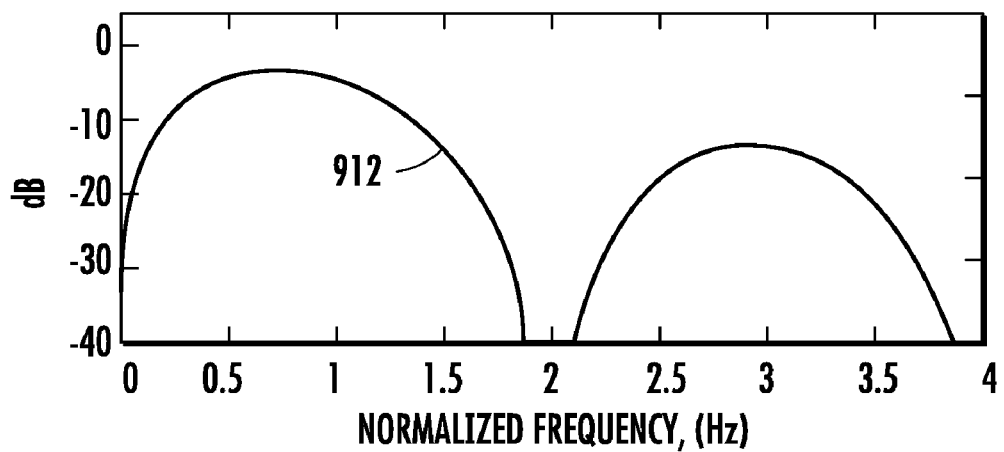
FIG. 9A2

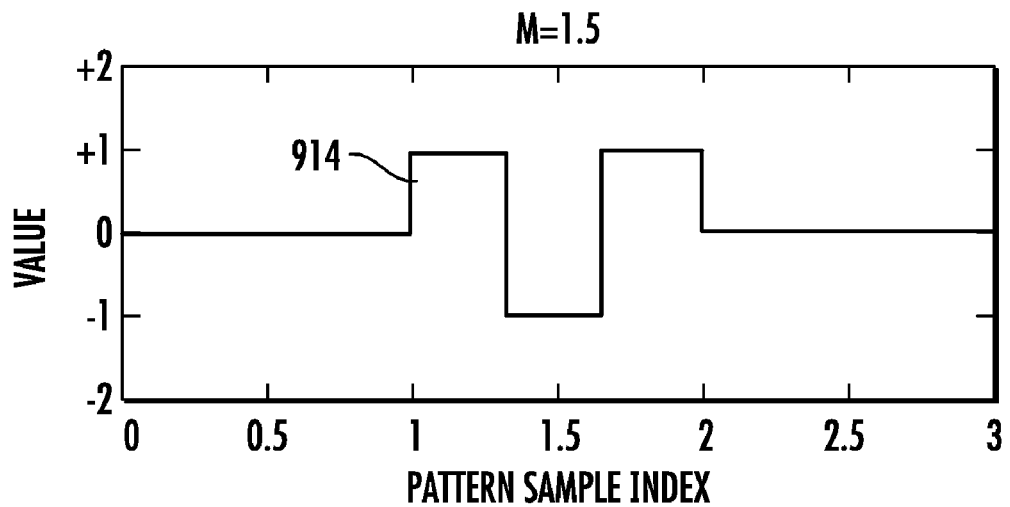
FIG. 9B1
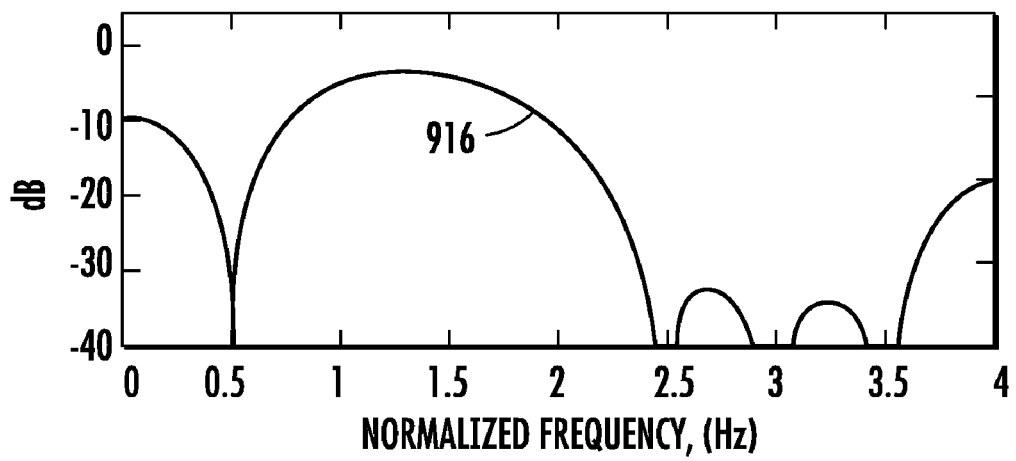
FIG. 9B2

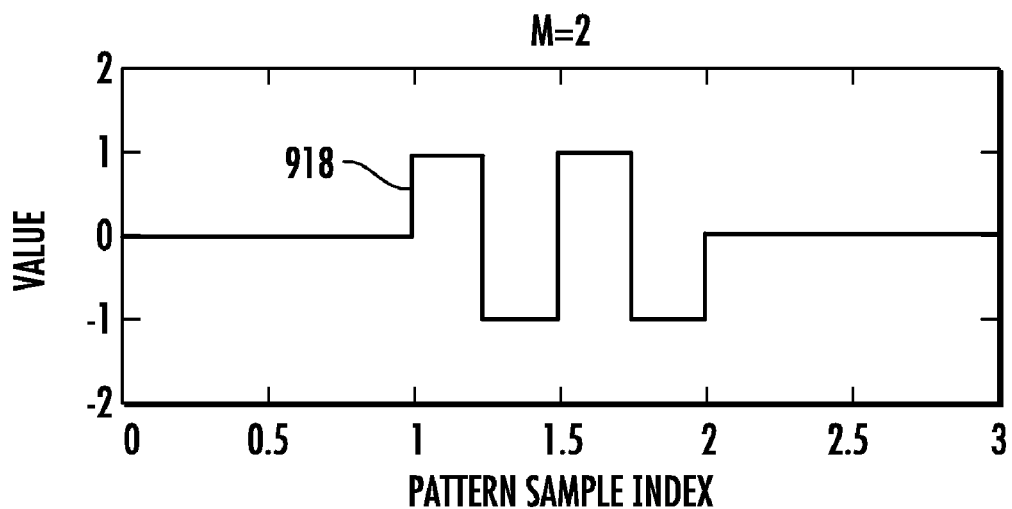
FIG. 9C1
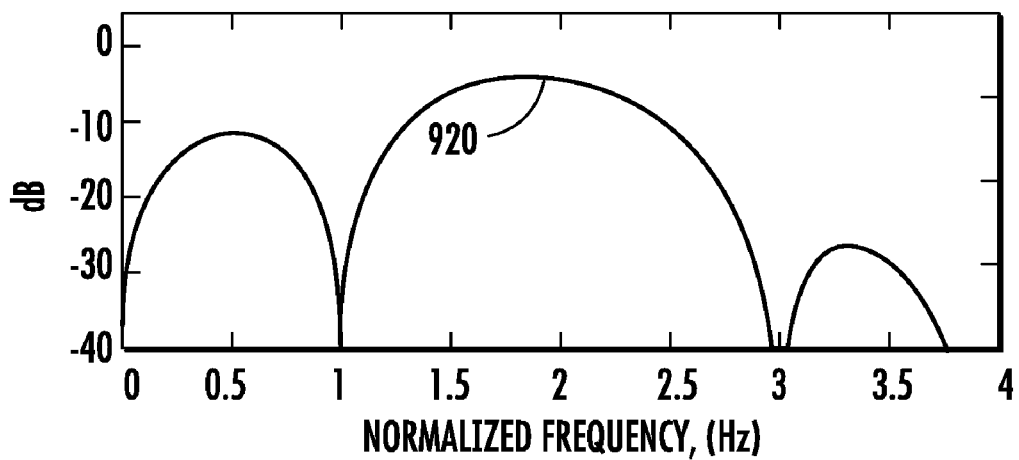
FIG. 9C2

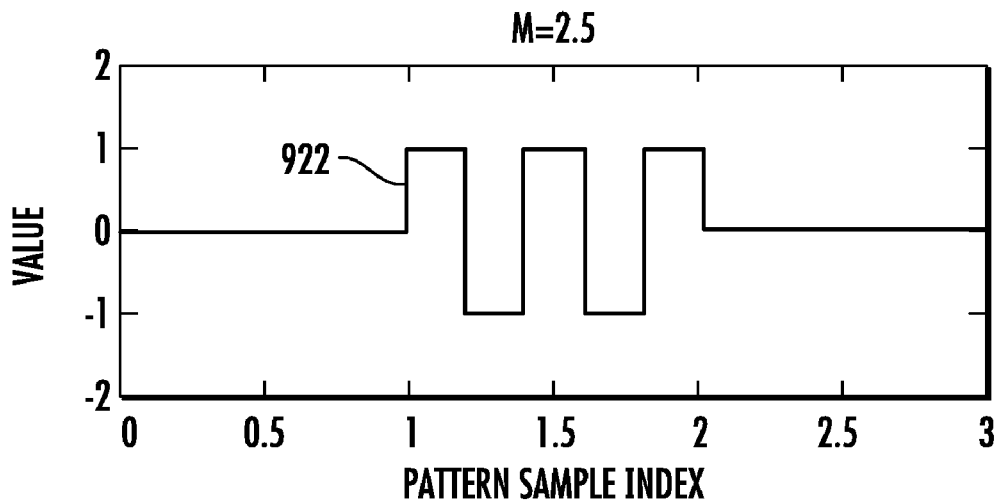
FIG. 9D1
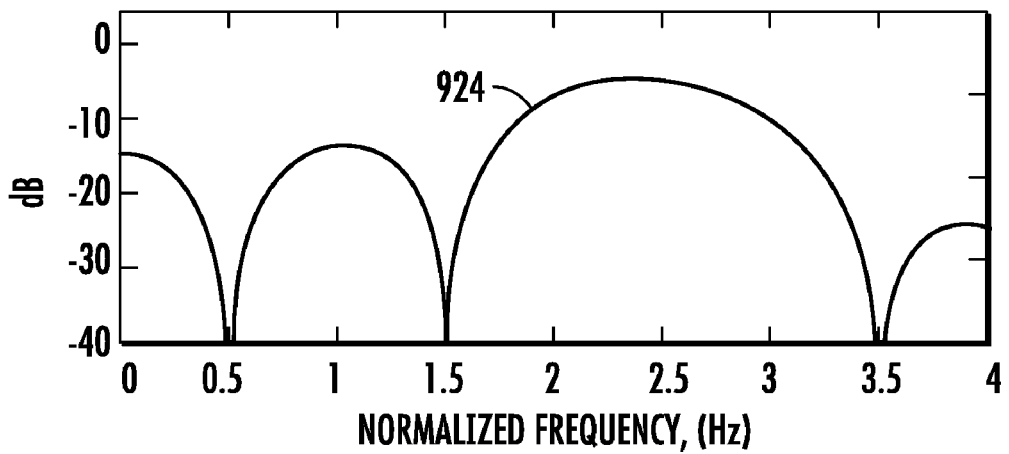
FIG. 9D2

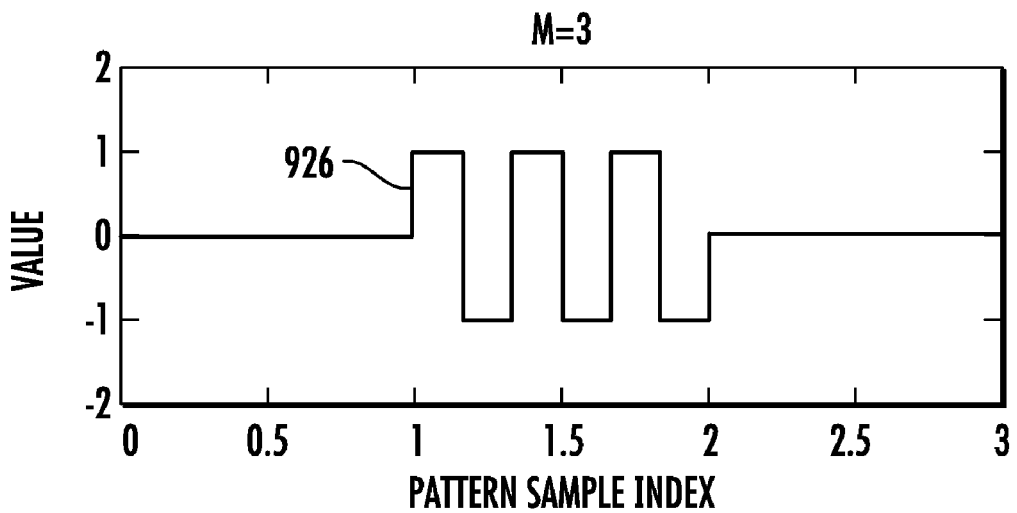
FIG. 9E1
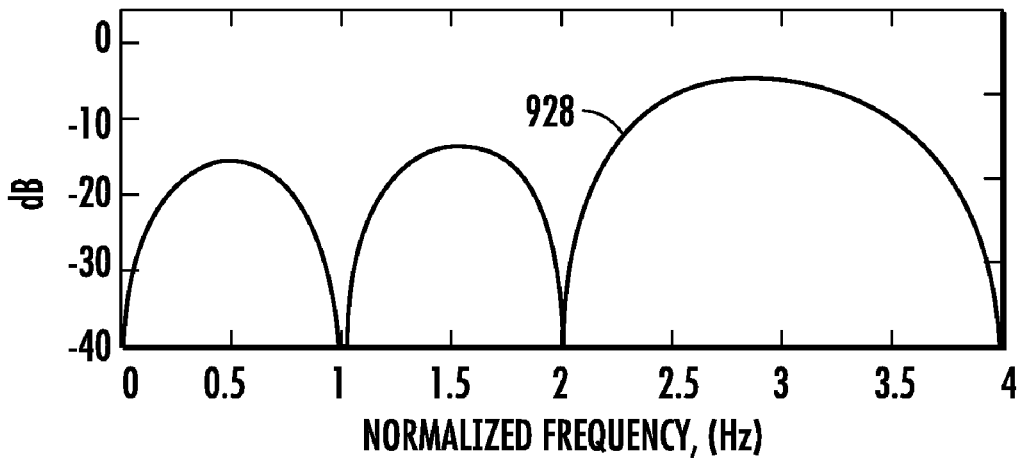
FIG. 9E2

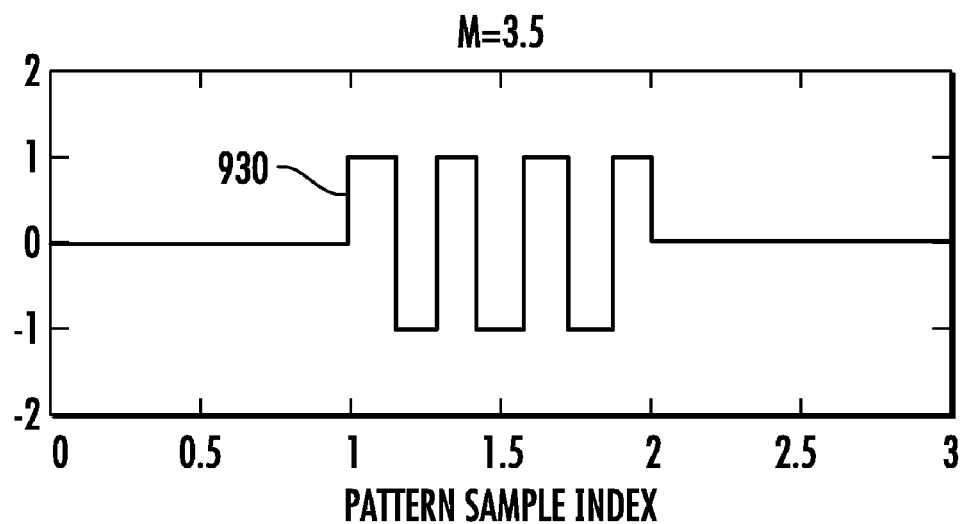
FIG. 9F1
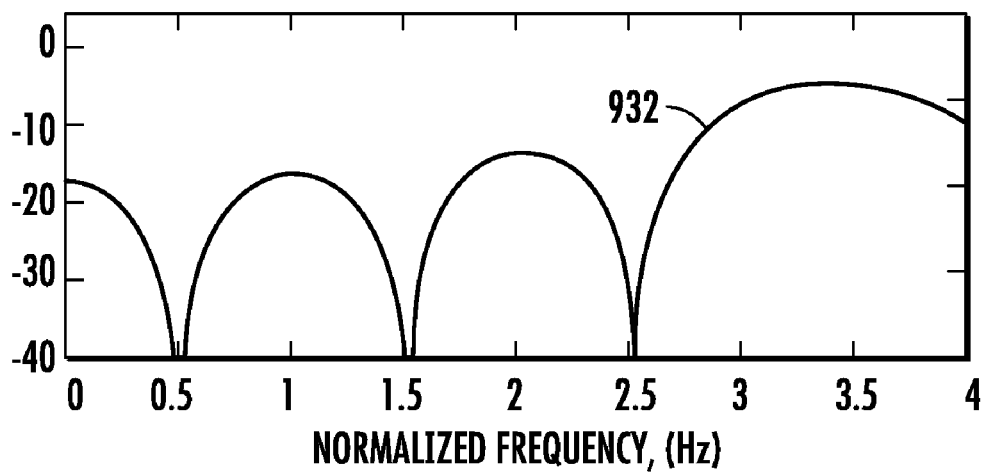
FIG. 9F2

SELECTED Umod EXAMPLE COMPARISON
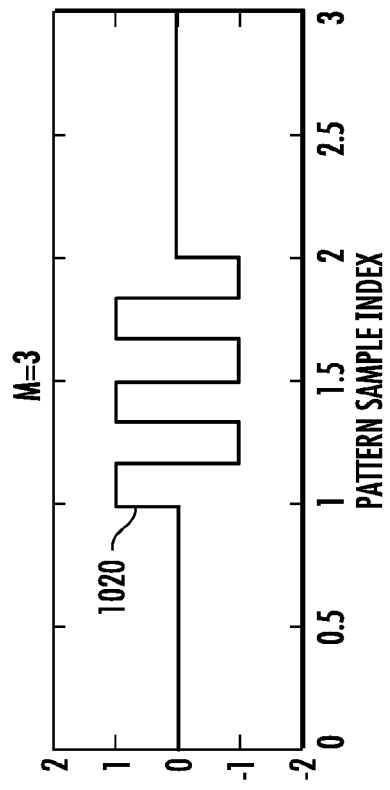
FIG. 10A1
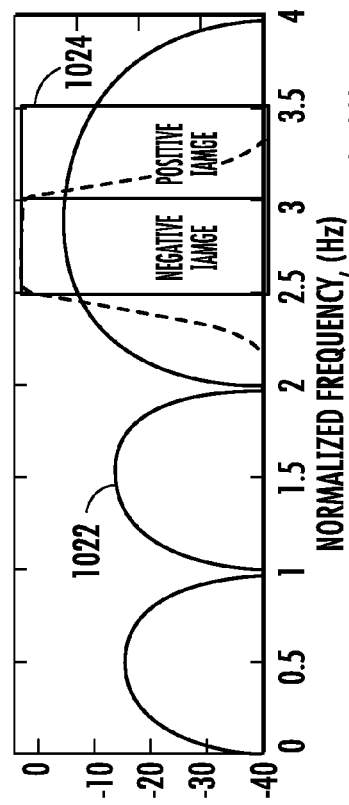
FIG. 10B1
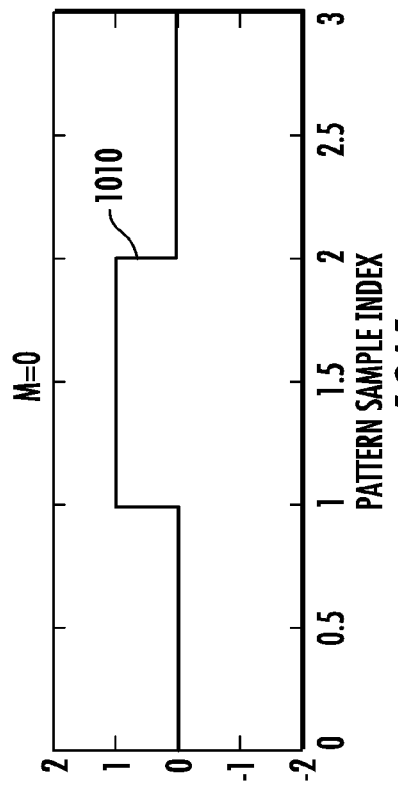
FIG. 10A2
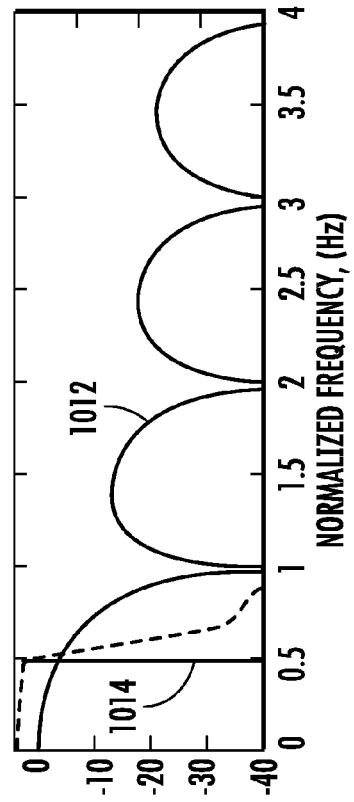
FIG. 10B2

DESCRIPTION OF DIRECTIONAL COMBINING

EXAMPLE 64-TAP TRANSVERSAL FILTER WEIGHTING IMPACT ON OUTPUT SPECTRUM

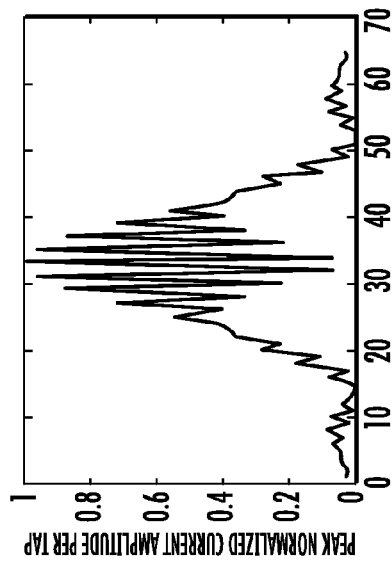

FIG. 14A

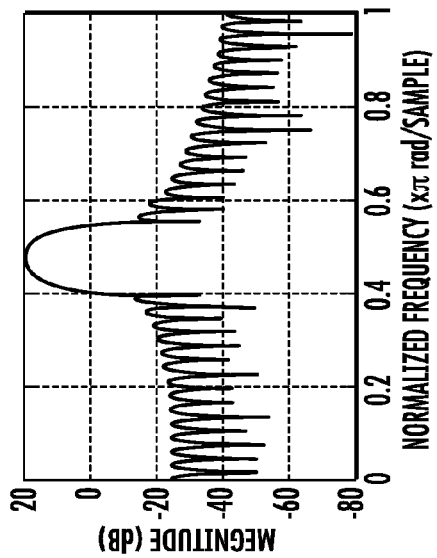

FIG. 14B

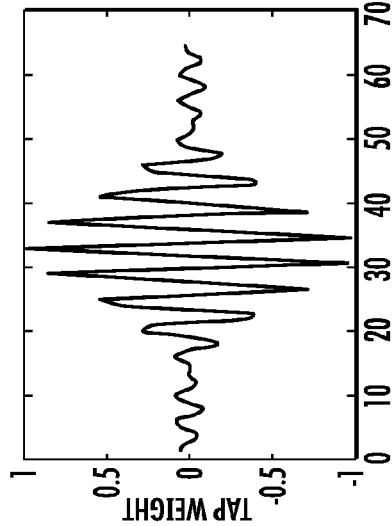

FIG. 14C

OUTPUT RF POWER IS DETERMINED BY COHERENT
CURRENT GAIN ACROSS THE LOAD IMPEDANCE $$P_{RF}(\omega) = \left| Z_0 I_{peakcell} \sum_{k=1}^{Ntap} h_k e^{-j\omega k T_s} \right|^2$$

OUTPUT RF POWER IS 100x
OF SINGLE PEAK CELL POWER
(10x OF SINGLE CELL CURRENT)

FIG. 15A

INPUT DC POWER IS TOTAL BIAS
VOLTAGE x CURRENT REQUIRED $$P_{DCin} = \Delta V_{bias} \cdot I_{peakcell} \sum_{k=1}^{Ntap} |h_k|$$

DISSIPATED POWER AND CURRENT IN
ARRAY IS ~15x OF PEAK CURRENT
CELL IN ARRAY

FIG. 15B

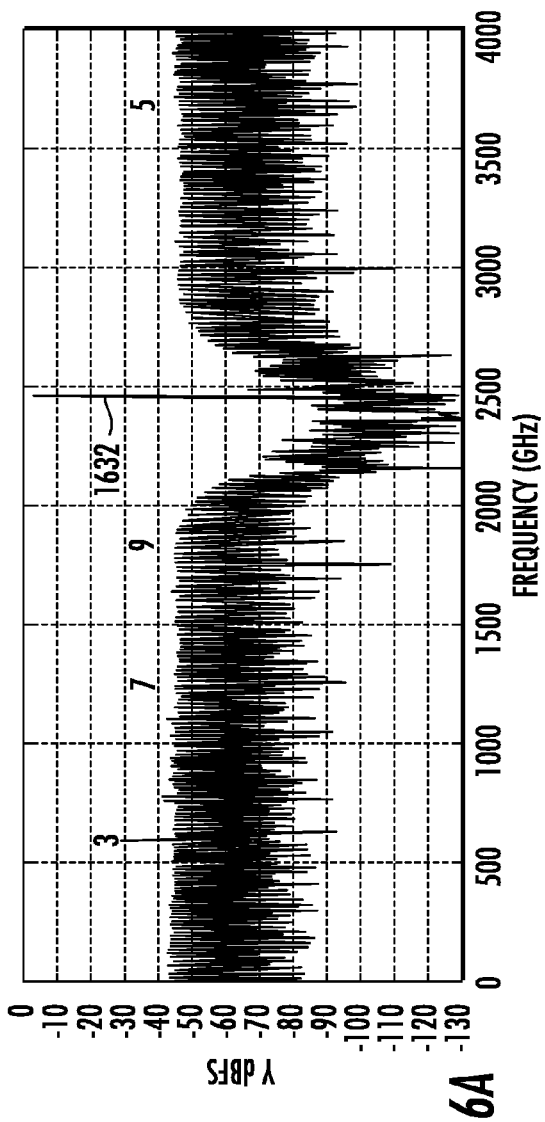
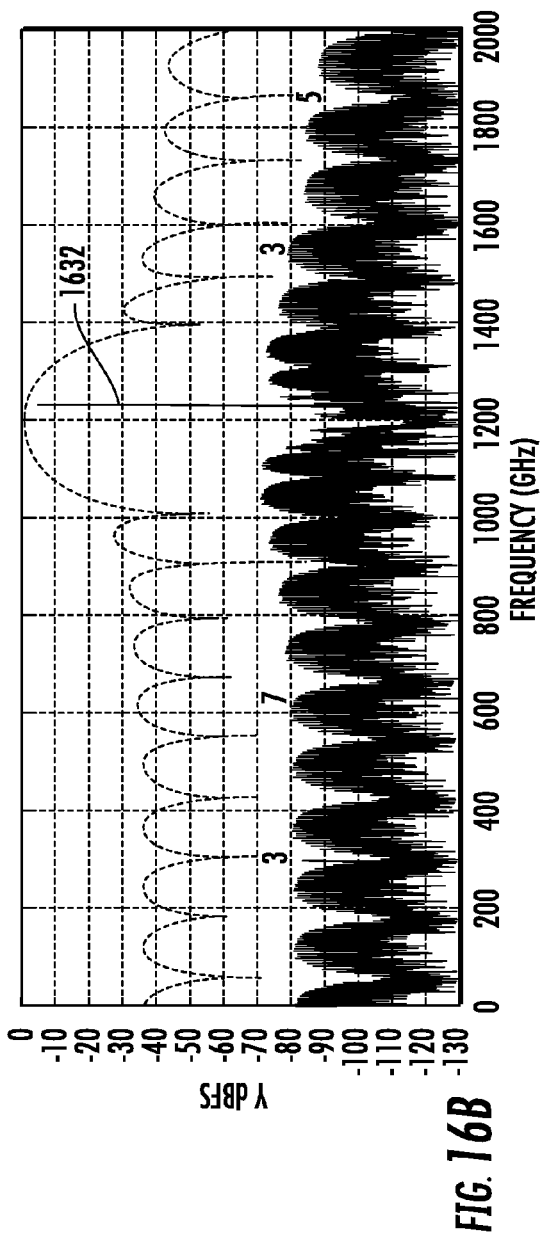
FIG. 16A
FIG. 16B

DIRECT RADIO FREQUENCY GENERATION USING POWER DIGITAL-TO-ANALOG CONVERSION

FIELD OF THE INVENTION

This invention relates to the generation of radio-frequency signals, and more particularly to direct generation of radio-frequency signals from digital signals.

BACKGROUND OF THE INVENTION

It is frequently desirable to generate radio-frequency electronic signals for various signaling, sensing and communications purposes. When radio-frequency (RF) electromagnetic signals must be transmitted, it is often necessary to transmit high power so as to easily overcome distance-related and other losses.

In the past, the term "radio frequencies" was interpreted to mean a limited range of frequencies, such as, for example, the range extending from about 20 KHz to 2 MHz. Those skilled in the art know that "radio" frequencies as now understood extends over the entire frequency spectrum, including those frequencies in the "microwave" and "millimeter-wave" regions, and up to light-wave frequencies. Many of these frequencies are very important for commercial purposes, as they include the frequencies at which radar systems, global positioning systems, satellite cellular communications and ordinary terrestrial cellphone systems operate.

The prior art includes many methods for producing high power radio-frequency signals. For example, a low-frequency or baseband analog signal generator produces signals which are applied to one or more frequency upconverter fed by one or more intermediate frequency generators, to thereby produce the desired high-frequency signal. This process often undesirably results in the production of spurious signals, which in turn requires additional filtering for reducing the amplitude of the spurious signal without significantly affecting the desired signals. The upconverted signal is separately amplified with a high-power amplifier to produce the desired high-power transmit signal. The power amplifier tends to be highly nonlinear when operated efficiently (that is, near saturation), and consequently tends to produce distortion when used for multicarrier applications. Upconverters suffer from similar nonlinearity effects.

In the transmission of signals that include multiple combined signals, such as a plurality of independent channels, modulation techniques with amplitude modulation or both amplitude and phase modulation such as multibit Quadrature Amplitude Modulation (QAM) waveforms, and signals that contain multiple simultaneous beams in the context of phased array antennas, the distortion of the heavily saturated amplifiers adds unwanted components to the transmitted signals. These unwanted components are known as intermodulation products. These intermodulation products may prevent proper system operation. The intermodulation products may be viewed as a form of error. This error limits the amount of information which can be transmitted through the channel. A prior-art approach to enhancing the spectral purity of the transmitted signals can include the use of a power amplifier capable of more power than that actually transmitted, to thereby tend to operate the amplifier in a more linear region of its characteristic. This is an effective solution, but is inefficient in terms of power consumption, and can also be expensive.

The prior art often addresses the efficiency issue by predistortion of the input signal of an amplifier operated in a nonlinear portion of its characteristic, which is more efficient than the linear portion. Another method uses feedforward amplifier techniques which involve the use of amplifiers for the desired signal in conjunction with amplifiers for the distortion, with directional couplers for summing the distortion component in the amplified desired signal with a signal in antiphase with the distortion component. All of these techniques suffer from narrow bandwidth over which distortion cancellation is effective. Additionally, these schemes may be adversely affected by environmental factors such as temperature, which may cause them to fall out of alignment. Even when operating properly, the achievable distortion suppression is not large.

Another prior art solution for producing high transmitter power is that of a direct digital synthesizer (DDS), usually combined with a bandpass filter device in the form of a tunable filter or a switchable analog filter bank, driving a power amplifier. Such a DDS system typically includes a source of signal parameter information, such as phase change per unit time, amplitude as a function of time, and the like. It also includes an accumulator and a phase-to-amplitude converter, often implemented as a "Sine ROM" combined with a polynomial interpolator. ROM stands for read only memory device and a Sine ROM is programmed to look-up an amplitude word output in response to a phase word input. The use of sine ROMs is described, for example, in U.S. Pat. Nos. 4,584,541 and 4,628,286. Further, the DDS system typically includes a digital-to-analog converter (DAC) for converting the amplitude represented by the digital representation into the desired radio-frequency signal.

The use of digital nonlinear techniques for generation of predistortion signal can be introduced into the DDS system, often through appropriate control of the phase and amplitude of the DDS, in order to generate an RF predistorted signal which compensates for the amplifier distortion, particularly when multiple signals must be simultaneously transmitted.

These systems are complex and tend to be limited in the spectral purity of their output signals. When multispectral signals are desired in a DSS system, only the DAC can be common. The DAC converters are subject to amplitude and time errors in producing the reconstruction of the desired RF signals, thereby distorting the single or multiple carriers. The combined effect of the DDS chain limits its utility for generating signals without loss of information. In practice, the predistortion signals produced by DDS systems are limited both by the quality of the DAC in the DDS and by the effectiveness of the predistortion technique itself. While the digital algorithm provides a higher degree of freedom than does an analog system, the digital prediction algorithm or system never fully matches the amplifier distortion and often gives less improvement than might be desired.

Improved or alternative radio-frequency signal generators are desired.

SUMMARY OF THE INVENTION

An apparatus according to an aspect of the invention is for generating radio-frequency signals directly from digital signals representing the instantaneous amplitude of the desired radio-frequency signals. The apparatus comprises a sigma-delta encoder coupled to receive the digital signals, for generating sigma-delta encoded digital signals at a sampling rate fs, and a tapped digital shift register including an input port coupled to receive the sigma-delta encoded digital signals, clocked at rate fs or a multiple thereof. The tapped digital shift register also includes a plurality of output ports at which delayed digital signals appear. Sign weighting logic processes each tapped delayed digital signal. The sign weighting logic implements an inversion or not inversion state with a unique programmed state at each tap. Alternatively, the sign weighting logic may also include an additional stage of logic for modulating the sign. The modulation logic is coupled to a second modulation clock that is common to all taps, and implements sign modulation to define a higher order nyquist band to be emphasized. A set of DAC cells is provided. Each cell of the set of DAC cells is coupled for receiving one of the delayed digital signals from shift register or the delayed and sign weighted digital signals from the sign logic or the delayed, sign weighted and modulated digital signals from the modulation logic, for converting the corresponding tapped digital signal into a current. The set of DAC cells therefore produces or generates a set of currents. Weighting means are coupled to the set of DAC cells, for weighting the individual currents of the set of currents so that the radio frequency signals are reconstructed within a finite passband. Combining means are coupled to the set of DAC cells, for combining the set of weighted currents into a combined current representing the reconstructed signal. The reconstructed signal is generated over a range of frequencies defined by the emphasized higher order Nyquist band. Outside this frequency range aliasing terms are suppressed by a filtering means. In an advantageous embodiment, filtering and impedance matching means are coupled to receive the combined current for reducing the aliasing components and for increasing the output power. In this advantageous embodiment, both the sampling clock is selected to achieve an operational bandwidth and the modulation clock is selected as a multiple of one half the sampling rate to emphasize the reconstruction of signals in the desired operational band corresponding to the desired output RF frequency range.

A method according to another aspect of the invention is for generating radio-frequency signals from first digital signals which represent the instantaneous amplitude of the desired radio-frequency signals. The method comprises the steps of encoding the first digital signals with Sigma-Delta encoding to thereby produce Sigma-Delta encoded signals, and delaying the bits of the Sigma-Delta encoded signals to thereby produce a plurality of differently delayed bits. The delayed bits are converted into a plurality of currents constituting a set of currents. The currents of the set are summed to produce the desired radio-frequency signals. In an especially advantageous mode of the method, the individual currents of the set of currents are weighted according to predetermined amplitude and phase representing a coefficient of a filter. In another advantageous mode of this method, the step of delaying the bits of the Sigma-Delta encoded signals comprises the step of applying the bits of the Sigma-Delta encoded signals to a serial shift register, which may be a clocked serial shift register. When the delayed digital signals are ternary, the registers are two-bit registers. To achieve bandpass and arbitrary filter response for this mode, the sign logic is operated to implement the sign portion of the filter coefficient, and the DAC current is adjusted to implement the amplitude portion of the coefficient. This method of operation results in an electronically adjusted transversal reconstruction filter where the pass band resides within the Nyquist band. In turn this Nyquist band corresponds directly to the RF transmit band of interest. The combined effect is to reconstruct spectrally pure RF signals over one or more pass bands simultaneously. Low intermodulation products are produced when operated to produce simultaneous signals, at the full available power. Furthermore, the sampling rate employed may be smaller than RF transmit frequency but must be at least twice the operational bandwidth.

BRIEF DESCRIPTION OF THE DRAWING

FIG. 4c is a simplified representation of an alternative back port termination for the arrangement of FIG. 4a;

FIG. 5 is a simplified block diagram illustrating some details of the Umod portion of the DAC cell that processes the input digital signals from the shift register to impose a weighting sign and higher order Nyquist modulation via a Umod clock signal of FIG. 4a;

FIGS. 9a1, 9a2, 9b1, 9b2, 9c1, 9c2, 9d1, 9d2, 9e1, 9e2, 9f1, and 9f2 generally represent Umod waveforms formed within each transversal DAC cell from the input data and Umod clock for upconverting the input data to higher-order Nyquist bands, and more specifically FIG. 9a1 is a plot of ternary value versus digital pattern sample index for a Umod frequency=M·fs, where the clock multiplier is M=1, and FIG. 9a2 is a plot of response in dB versus normalized frequency for the pattern index of FIG. 9a1, FIG. 9b1 is a plot of ternary value versus digital pattern sample index for a clock multiplier of M=1.5, and FIG. 9b2 is a plot of response in dB versus normalized frequency for the pattern index of FIG. 9b1, FIG. 9c1 is a plot of ternary value versus digital pattern sample index for a clock multiplier of M=2, and FIG. 9c2 is a plot of response in dB versus normalized frequency for the pattern index of FIG. 9c1, FIG. 9d1 is a plot of ternary value versus digital pattern sample index for a clock multiplier of M=2.5, and FIG. 9d2 is a plot of response in dB versus normalized frequency for the pattern index of FIG. 9d1, FIG. 9e1 is a plot of ternary value versus digital pattern sample index for a clock multiplier of M=3, and FIG. 9d2 is a plot of response in dB versus normalized frequency for the pattern index of FIG. 9d1, FIG. 9f1 is a plot of ternary value versus digital pattern sample index for a clock multiplier of M=3.5, and FIG. 9f2 is a plot of response in dB versus normalized frequency for the pattern index of FIG. 9f1;

FIGS. 10a1, 10a2 and 10b1, 10b2 show emphasized frequency spectra for two particular examples of multiplier M, namely FIGS. 10a1 and 10a2 show lowpass results for M=0 and FIGS. 10b1 and 10b2 show bandpass results for M=3, and an additional filter response is shown representing the coupling between the transversal DAC and intended load, where the filter response selects the desired Nyquist band, and for the case of M=3, an upper or lower Nyquist band can be selected;

FIG. 14a is a normalized plot of tap weight as a function of tap number in a tapped transmission line, FIG. 14b plots the spectrum for the weights of FIG. 14a, and FIG. 14c plots the normalized current amplitude versus tap number for the weights of FIG. 14a;

FIG. 15a expresses an equation for output power of a system according to an aspect of the invention where the total output power is typically 100 times greater than the power delivered by the maximum current cell within a 64 tap array example where the total power dissipated is typically 15 times greater than the maximum power dissipated in the maximum current cell within the same 64 tap array example, and FIGS. 15a and 15b illustrate the coherent combining power gain of the transversal DAC;

FIG. 16a plots the frequency-amplitude spectrum of the input digital sigma delta ternary pattern encoding a single tone signal within the sigma delta pass band selected through programming of modulator of FIG. 3, and FIG. 16b plots the frequency-amplitude spectrum of the transversal DAC output signal produced by a 32 tap array, including the transfer function of the transversal DAC filter where the digital controlled weights are selected to produce a bandpass filter corresponding to the sigma delta pass band.

DESCRIPTION OF THE INVENTION

Figure 1:
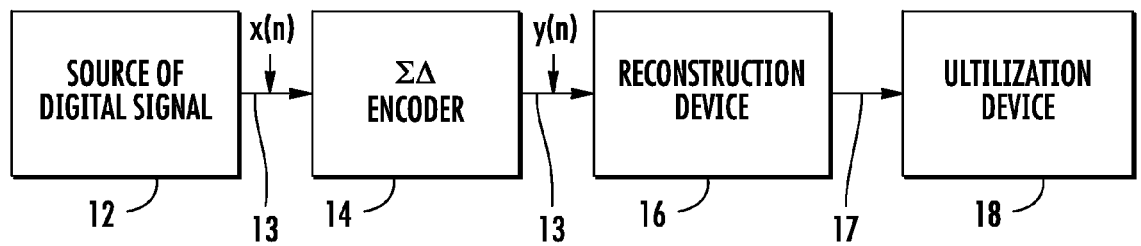
FIG. 1 is a simplified block diagram illustrating a radio-frequency signal generator according to an aspect of the invention, including a sigma-delta ($\Sigma\Delta$) encoder and a reconstruction device or apparatus.

FIG. 1 is a simplified block diagram illustrating a system 10 according to an aspect of the invention. In FIG. 1, a source 12 produces digital signal time sample of the desired transmit signals from waveform controlling parameters at a given sampling or data rate and with values represented with high bit resolution. Thus, multiple simultaneous or arbitrary signals representing instantaneous amplitude of the desired radio-frequency signals are produced and are represented with sufficient precision to enable the digital signal word round-off error effects to be negligible. When a high enough sampling rate is used the RF frequency is represented directly, including its carrier frequency within the first order Nyquist band, which is between 0 Hz and ½ the sampling frequency. Also a lower actual frequency may be represented when the transmit carrier frequency exceeds ½ of the sampling frequency, in conjunction with higher order Nyquist modes of operation. The digital signals from source 12 are applied to a sigma-delta ($\Sigma\Delta$) encoder illustrated as a block 14. Sigma-delta encoder 14 is well known in the art for converting an input high-resolution signals into a coarsely quantized output signal preserving the high resolution of the input signals over a given pass band. The encoded spectrum contains out-of-band quantization noise which can be relatively large in total power in addition to low in-band quantization noise and the desired high power transmit signal. In this particular use of the sigma delta encoder, the input high resolution signal is the digital signal produced by source 12, and thus the entire implementation of the encoder 14 is digital in nature. The sigma-delta encoded and coarsely quantized signals are applied to a reconstruction device or circuit represented as a block 16, which converts the sigma-delta encoded digital signals into analog signals having the characteristics defined by the desired digital input signal over the pass band, while suppressing the undesirable out-of-band noise terms produced by the encoder. In general, the analog signals produced by reconstruction device 16 are radio-frequency (RF) signals over an operational pass band. The resulting radio-frequency signals are applied by way of a path 17 to a utilization device illustrated as a block 18. In a particular embodiment of the invention, the utilization device 18 is an antenna, such as an array antenna element, for transmitting the reconstructed passband signals anywhere within the antenna operational pass band. The reconstruction device 16 provides conversion of the digital input data stream directly into a linear transmit signal of sufficient power with full power utilized without degradation due to distortion effects. Also a transmit signal is produced even if the output frequency exceeds the input Nyquist frequency range, which is equal to one half the data rate. Another function imbedded in the reconstruction device 16 is that of a programmable arbitrary filter. Generally this filter function implements a bandpass filter with adjustable center frequency and bandwidth, with center frequency tuning range covering an operational bandwidth and a pass band accommodating the modulation bandwidths of interest.

Figure 2:
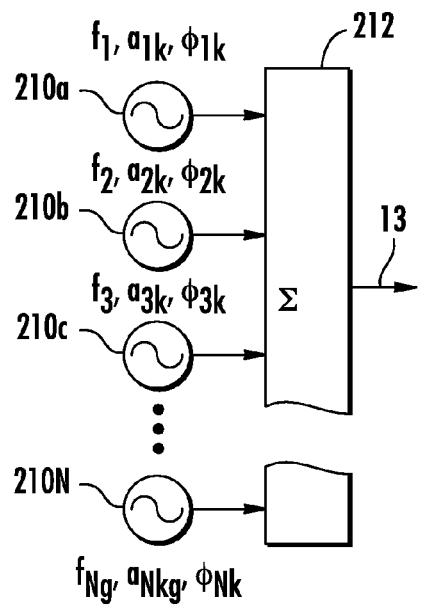
FIG. 2 is a simplified block diagram of a signal source for driving the signal generator of FIG. 1.

FIG. 2 is a simplified representation of source 12 of digital data or signals. In FIG. 2, a set 210 of digital signal sources includes a plurality of independent digital signal sources 210a, 210b, 210c, . . . , 210N. Each of the independent sources can be modulated to carry information, such as radar signals, communications signals, or any other band-limited signal modulations. Each of independent digital signal sources 210a, 210b, 210c, . . . , 210N applies its high resolution digital signals to a digital summing circuit or adder 212. The summed signals are made available on a signal path 13. Each of the sources represents or generates the signals for one transmitted beam from an antenna. For an array antenna, the sources represent or generates the signals for one digitally controlled beam, where the phase, time delay and amplitude are varied between elements of the array for each signal such that independent beam signals can be generated. The digital signals produced by the signal source 210a are indicated as being at frequency $f_1$, amplitude $a_{1k}$, and phase $\phi_{1k}$, the digital signals produced by the signal source 210b are indicated as being at $f_2$, $a_{2k}$, $\phi_{2k}$, the digital signals produced by the signal source 210c are indicated as being at $f_3$, $a_{3k}$, $\phi_{3k}$, ..., and the digital signals produced by the signal source 210N is indicated as being at $f_N$, $a_{Nk}$, $\phi_{Nk}$. In these designations, the frequency (f) designation represents the possibility of different radio-frequency carriers for each of the antenna beams. The amplitude (a) and phase ($\phi$) designations refer to the relative amplitudes and phases of the radio-frequency signals which are transmitted on each of the beams. The subscripts K represent the value of the parameter at each of the different elements of the array antenna to which the signals are ultimately applied.

Figure 3:
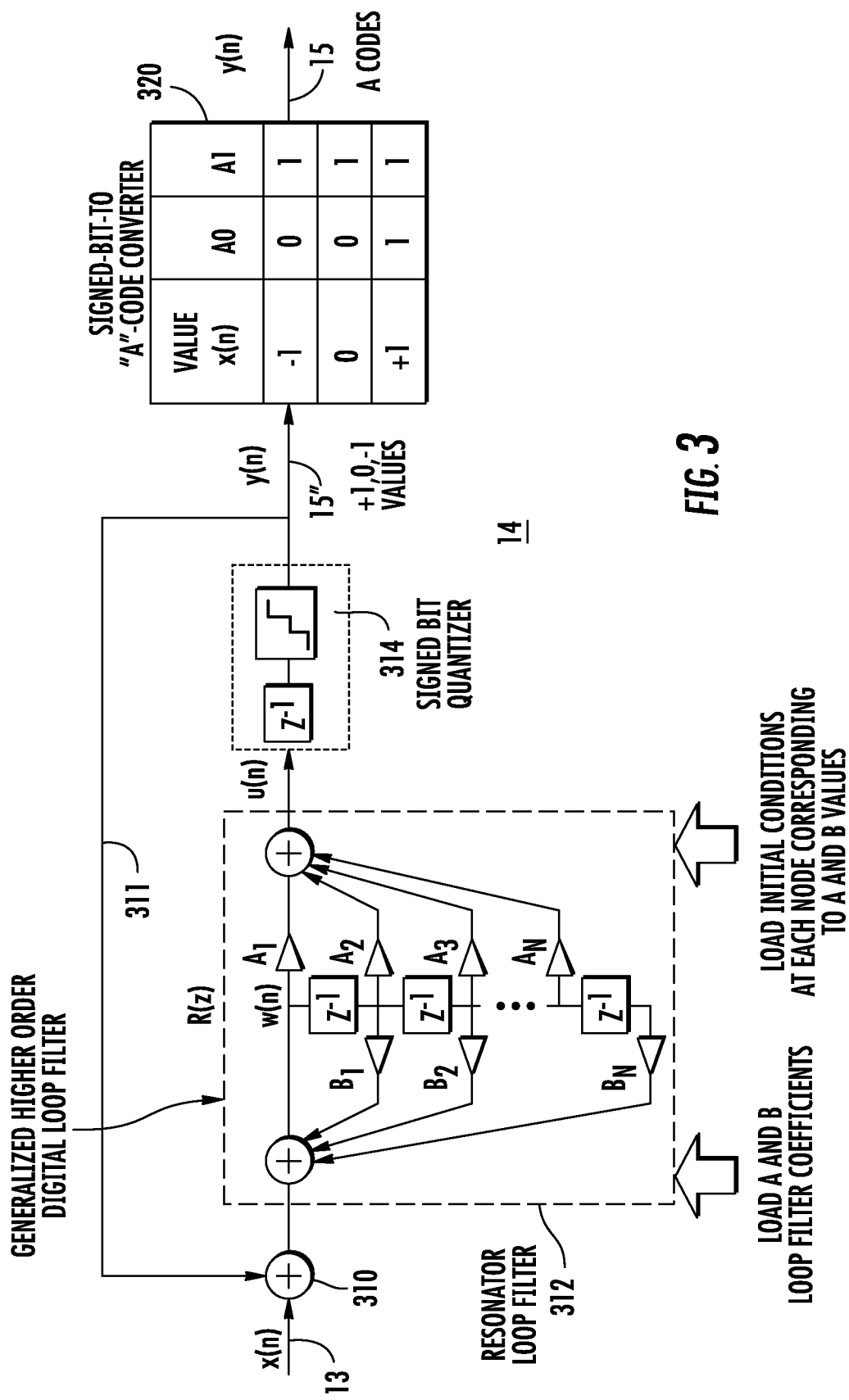
FIG. 3 is a simplified block diagram of one form which the sigma-delta ($\Sigma\Delta$) encoder or pattern modulator of FIG. 1 can take.

FIG. 3 is a simplified block diagram of a sigma-delta encoder or pattern modulator which may be used in block 14 of FIG. 1. In FIG. 3, the wideband digital signals x(n) are applied by way of path 13 to a summing circuit 310, which adds to the current value of the wideband digital signal a ternary feedback value from a path 311. In this context, "ternary" means that the signal represents three levels, which also in turn means that two digital bits can be used to represent those three levels, with one level left over, as suggested by the values appearing in the "A codes" block 320. The feedback signal applied to summer 310 by way of path 311 may be viewed as representing +1, 0, or −1, and the maximum level of the wideband high resolution input signal x(n) has value less than 1. Thus, the sum signal produced by summing circuit 310 will equal the wideband signal value if the feedback signal has the value of 0, and will represent the sum or difference of the wideband and feedback signals for feedback signals having values of +1 or −1, respectively. Thus, the sum signals produced by summing circuit 310 can range from approximately 0 to 1 when the feedback signal is 0, the sum signals can range from approximately 1 to 2 when the feedback signal is +1, and from 0 to −1 when the feedback signal is −1. The sum signals from summing circuit 310 are applied to a resonator loop filter 312, known in the art. In general, the resonator loop filter 312 is a generalized higher-order digital loop filter that receives the summed signals from summing circuit 310 and resonates the signal to produce closed-loop oversampled noise shaping of quantizer error. The resonator output signal is applied to a signed bit quantizer illustrated as a block 314. The delay element $z^{-1}$ illustrated as a part of signed bit quantizer 314 may be implemented as part of the resonator loop filter. Signed bit quantizer 314 receives the resonated signal and quantizes it to one of the three levels or states −1, 0, and +1 to produce the feedback signal on path 311 and the sigma-delta output signal y(n) on output path 15'. The signed bits produced by signed bit quantizer 314 are applied by way of path 15' to a signed-bit-to-A-code converter illustrated as a truth table 320. Truth table 320 can be implemented in many possible ways, but a simple way is to use a memory ROM.

Those skilled in the art know that the structures described in conjunction with FIGS. 2 and or 3 can be implemented as software instead of hardware or firmware. It is also known that if computed by any of the available means, the resulting patterns can be stored in memory for use at a later time.

Figure 4A:
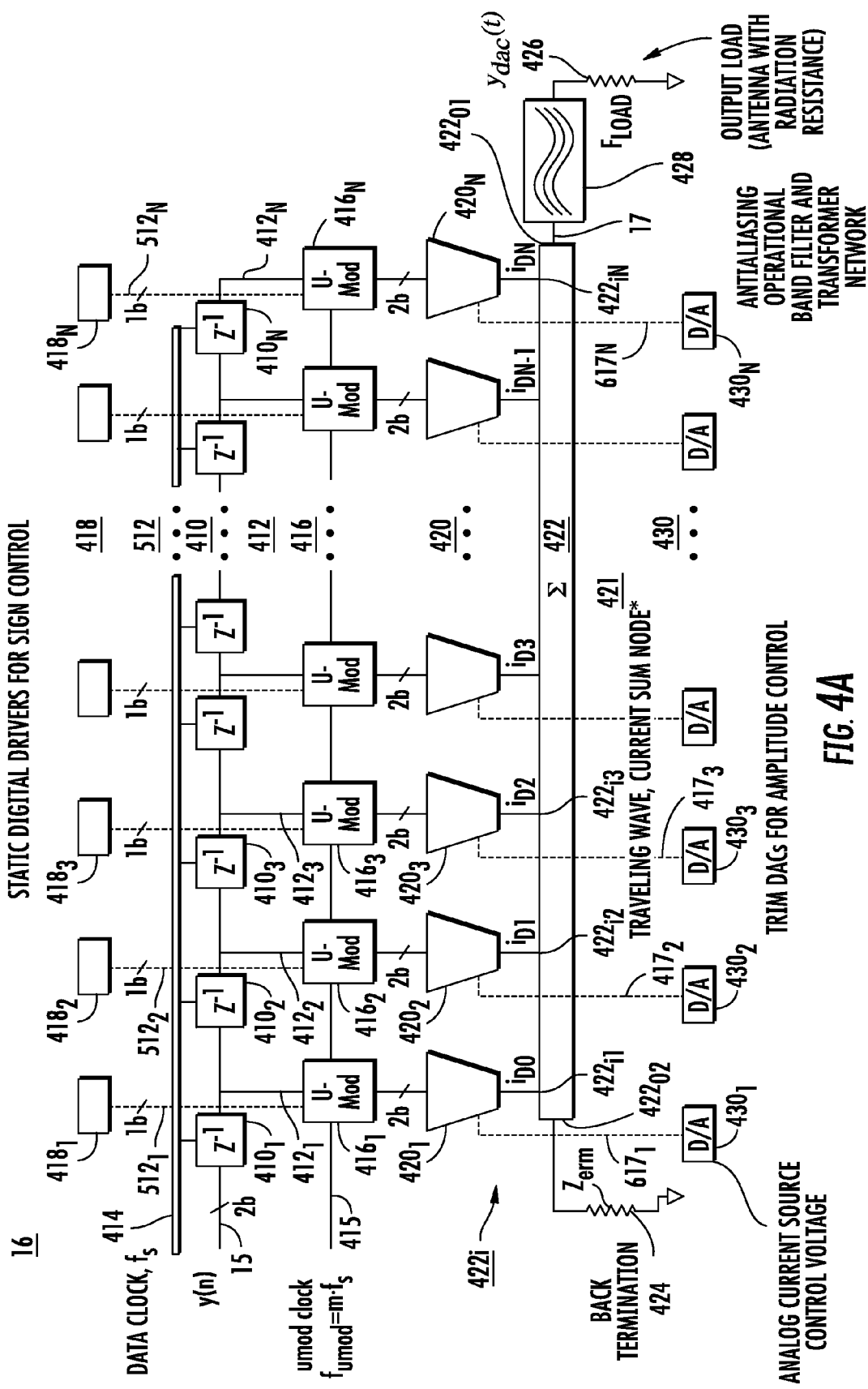
FIG. 4a is a simplified block diagram representing a ternary $\Sigma\Delta$ transversal filter DAC architecture according to an aspect of the invention.

FIG. 4a is a simplified diagram illustrating one possible form which reconstruction device 16 of FIG. 1 can take. In FIG. 4a, the sigma-delta ($\Sigma\Delta$) output data or signal y(n) from block 14 of FIG. 1 arrives by way of path 15 at the input of a tapped delay line 410 including delay elements $410_1$, $410_2$, ..., $410_N$. The delay line 410 may be a clocked two-bit shift register. A clock signal $f_s$ is applied by way of a path or transmission line 414 for control of the shift registers. Delay line 410 supports a plurality of taps $412_1$, $412_2$, ..., $412_N$ of a set 412 of taps. Thus, in the shift-register context, the two-bit signals appearing on the taps of set 412 are separated in time by one $f_s$ clock interval.

The two-bit data or signals appearing on the taps of set 412 of taps of FIG. 4a are applied to a set 416 of Unary modulators (Umods), some of which are designated $416_1$, $416_2$, ..., $416_N$. Each Umod, in turn, is associated with a DAC cell of a set 420 of DAC cells. A DAC cell is also referred to as a "transversal DAC tap." Thus, Umod $416_1$ is associated with a DAC cell $420_1$, Umod $416_2$ is associated with a DAC cell $420_2$, .... The Umods perform two functions, namely (a) signed inversion/noninversion and (b) dynamic inversion/noninversion. These functions may be viewed as being cascaded, and as constituting sign weighting and two-bit wave shaping. The signed weighting function implements inversion/noninversion to control the Umod output, so the DAC cell reconstructs either an effective positive current, an effective zero current, or an effective negative current at its "output" port in response to the ternary data values from the shift register. The ternary data steam is either inverted or noninverted at the ternary DAC output. The DAC output states may actually be implemented by a high current for positive levels, a middle current for the zero state and a zero current for the negative state, which is useful in a differential and AC coupled DAC implementation. This reconstruction is achieved through a two-stage process. In the first stage, the digital inputs provide data streams representing −1, 0, or +1. The DAC current will have a positive sign if (a) both the data bit and sign are positive or (b) if both the data bit and sign are negative. The DAC current will have a negative sign if the sign of the data is opposite to the sign implemented or imposed by the Umod. This process develops a sign weighted tap signal, where the weighting represents a static sign adjustment unique to each of the taps in the array of DAC cells. The second stage of the Umod function provides a modulation function for production of higher order Nyquist bands.

A Umod clock $F_{umod}$ is applied by a path 415 of FIG. 4a to the Umod blocks of set 416 of Umods and is also used to control the inversion/noninversion. The Umod blocks of set 416 of Umod blocks of FIG. 4a each produce two-bit data or signals which are applied to the two inputs of each digital-to-analog converter (DAC) cell $420_1$, $420_2$, $420_3$, ..., $420_N$ of a set 420 of DAC cells. Each Umod of set 416 of Umods receives a one-bit input signal from a corresponding static digital driver of a set 418 of static digital drivers. More particularly, Umod $416_1$ receives a one-bit signal from a static digital driver $418_1$ by way of a signal path $512_1$, Umod $416_2$ receives a one-bit signal from a static digital driver $418_2$, Umod $416_3$ receives a one-bit signal from a static digital driver $418_3$ by way of a signal path $512_1$, ..., and Umod $416_N$ receives a one-bit signal from a static digital driver $418_N$ by way of a signal path $512_N$. The static digital data from set 418 remains constant for a particular dwell of the shift registers during which signals are reconstructed. The static digital data from set 418, in conjunction with amplitude control from a set 430 of DACs, sets the amplitude and sign of the transversal filter coefficient implemented at each tap.

In FIG. 4a, each DAC cell of set 420 of DAC cells is represented by a trapezoidal symbol $420_1$, $420_2$, ..., $420_N$. Each DAC cell of set 420 of DAC cells is a high-impedance source of current (that is, each DAC cell is a current source), where the magnitude of the output current is controlled by the output data or signal of the associated Umod. A set 430 of digital control sources produces digital signals which control the magnitude of the currents produced by the associated DAC cells of set 420 of DAC cells. More particularly, a digital source $430_1$ produces a digital signal which controls the analog value of the current produced by DAC cell $420_1$, a digital source $430_2$ produces a digital signal which controls the analog value of the current produced by DAC cell $420_2$, a digital source $430_3$ produces a digital signal which controls the analog value of the current produced by DAC cell $420_3$, ..., and a digital source $430_N$ produces a digital signal which controls the analog value of the current produced by DAC cell $420_N$. The amplitude control sources 430 in combination with sign control sources 418 enable the weighting function, which defines a particular tap filter coefficient which is static during device operation where the filter is fixed. These two sources can be modified to produce a different filter function. Hence, the filter can be adjusted to change its characteristics through these weighting means.

The Umod blocks if receiving a clock in a high or low state will implement a second sign function that is common to the full set of DAC cells. By dynamically changing this sign through a clock the rate of which is equal to the data rate or a multiple of 1.2 times the data rate, 0/180 degree modulation of the digital data or signal occurs. This in effect produces a wave shaped waveform with center frequency that is higher than the first Nyquist band, which is defined as 0 to fs/2, where fs is the clock rate. The waveform emphasizes reconstruction of higher order Nyquist terms such as those between fs/2 and fs or 3fs and 3½ fs.

The currents produced by the set 420 of DAC cells of FIG. 4a, taken in combination, are the desired analog RF output signal of the system, and the currents produced by each DAC cell are components of the desired analog RF output signal. The controlled currents produced at the output ports of the DAC cells are applied to a current sum node 421, which may be in the form of a traveling-wave structure, such as a transmission line 422. In a particular embodiment, the currents produced by the various DAC cells $420_1, 420_2, \ldots, 420_N$ are applied to various input ports $422i_1, 422i_2, \ldots, 422i_N$ of a set $422i$ of input ports of a traveling-wave transmission line designated 422. Transmission line 422 defines a load end or load output port $422o_1$. As known to those skilled in the art, the transmission line 422 may be provided with a back termination 424, designated $Z_{erm}$ in FIG. 4a, at a second or back port $422o_2$.

Figure 17:
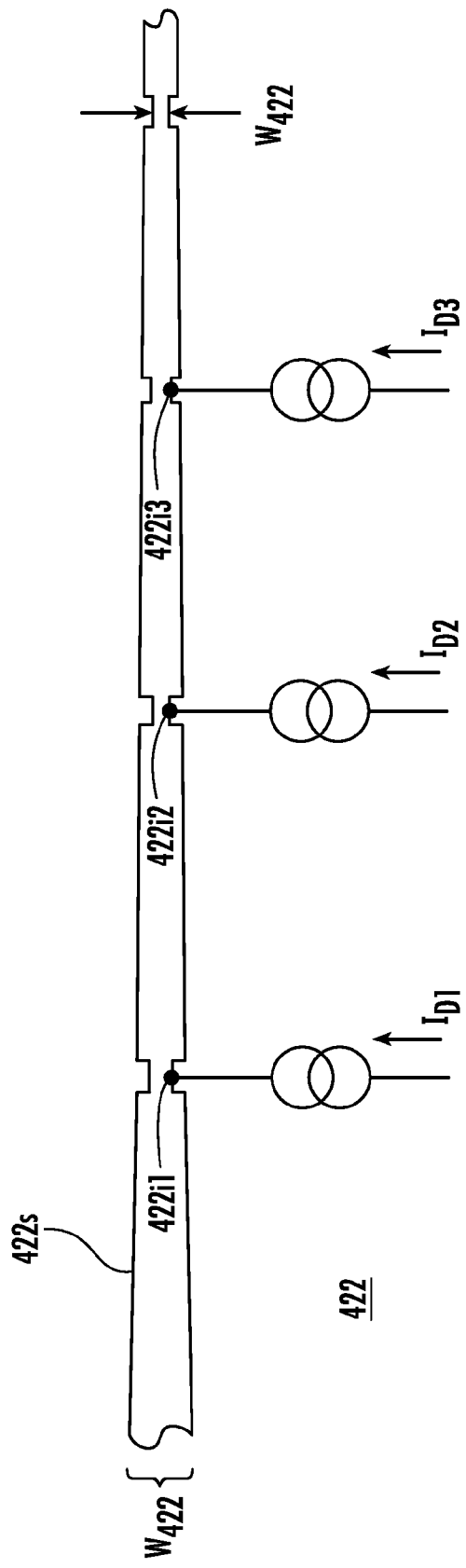
FIG. 17 is a simplified plan view, partially in functional form, of a strip conductor of a transmission line, with narrowed portions associated with each tap for tending to provide impedance correction.

The transmission line 422 of FIG. 4a may be an actual physical transmission line such as a microstrip line or stripline, or it may be a synthetic transmission line (one made up of discrete inductors and capacitors). In either case, the capacitance associated with the output port of the DAC cell associated with or driving each input port of set $422i$ is made a part of the transmission-line equivalent circuit. Put another way, the inductance and capacitance characteristics of the transmission line 422 are selected to have the desired values in the presence of the capacitance of the associated DAC cells. This is readily accomplished in the context of a strip conductor transmission line by making the overall width of the strip conductor (not at the location of the tap) slightly less than that which provides the desired characteristic impedance, as illustrated in the plan view of FIG. 17. In FIG. 17, a combining transmission line 422 strip 422s has two different widths at various locations, namely a wide width $W_{422}$ and a narrow width $w_{422}$. Wider width $W_{422}$ exists along most of the length of the strip conductor 422s, except at those current (i) injection or tap locations $422i1, 422i2, 422i3 \ldots$. The width $W_{422}$ is selected, as known in the art, in conjunction with at least the spacing over (or above) ground and the dielectric constant of the space between the strip and the underlying region or ground, to provide the desired characteristic impedance. This characteristic impedance will often range between 5 ohms and 50 ohms. Typically the lower portion of the characteristic impedance range may be selected to enable increased output power under voltage break down limitations of the switching devices connected to each tap point. For delivering the maximum power to a load, an impedance transforming device may be used to connect and transform the output end of the lower characteristic impedance combining transmission line to a higher impedance load. For higher bandwidth, and lower loss resulting from the strip conductor, a characteristic impedance at the upper end of the range may be selected. The additional capacitance of the current sources at the tap points would ordinarily result in reduction of the characteristic impedance at the tap point. Each of these points of lower characteristic impedance represents an impedance discontinuity, which undesirably results in signal reflection. The cumulation of the effects of the increased capacitance at equally-spaced tap points would, if allowed, tend to result in a transmission line with lower characteristic impedance than the strip conductor provides if the spacing between the tap points is a small fraction of a wavelength at the frequencies of operation. This fraction is typically less than or equal to 10% of the wavelength in monolithic microwave integrated circuits. In this case the distances may be on the order of tens to hundreds of micrometers. If the spacing is larger, such as 25% of a wavelength, it acts as a filter-like structure which selectively attenuates signals at particular frequencies. For both cases the effect of adding the capacitance may produce undesired reflection over the frequency range of interest.

This effect is ameliorated by narrowing the width of the strip conductor at each tap point, or the overall width of the conductor, thereby reducing the shunt capacitance of the transmission line at the tap point, or overall, and raising the characteristic impedance. If the amount of capacitance reduction at each tap point attributable to the reduction of strip width to $w_{422}$ equals the amount of capacitance added by the current source, the impedance discontinuity at each tap point is reduced or eliminated, which tends to improve the all-pass characteristics of the transmission line. Thus, the narrow-width portions of strip transmission line 422 of FIG. 17 tend to raise the characteristic impedance of the transmission line, and the presence of the DAC cell capacitances distributed across the length of the transmission line lowers or corrects the characteristic impedance to provide the desired value. In the context of a synthetic transmission line, the shunt or parallel capacitance values of the transmission line are made less than the optimum value by the value of the capacitance of each DAC cell at that location.

For a monolithic microwave integrated circuit embodiment, or one involving multiple integrated circuits connected in a series manner, the length between each tap point is less than 10% of the wavelength at frequencies 20 GHz and lower. The overall length of the array of taps, however, may be several wavelengths long. In this case, one conductor width $W_{422}$ may be used, with the overall width adjusted to provide reduced capacitance with respect to the final desired characteristic impedance. For millimeter wavelengths or at frequencies above 20 GHz, a two width transmission line approach may be used with some improved effect.

The currents applied to the various input ports $420_1, 420_2, \ldots, 420_N$ of transmission line 420 of FIG. 4a from the DAC cells of set 418 of DAC cells in general propagate in both directions along the transmission line, summing or canceling according to their relative phases as they progress. If the propagation in both directions were to be "equal," half of the energy delivered to the transmission line from the DAC cells would be dissipated in the back termination 424. According to an aspect of the invention, propagation delays are introduced through the clock distribution transmission line paths, which compensate delays inherently produced in the DAC output combining synthetic transmission lines. The delays control the relative timing of the conversion of the digital data or signals driving the DAC cells into analog form, so that effective propagation delay of analog radio-frequency energy in the direction of the back termination 424 cancels or sums out-of-phase, and propagation of radio-frequency energy toward the load end 422$_{o1}$ adds or sums in-phase. The cancellation of signal propagating toward the back termination doubles the effective power efficiency of the array of DAC cells by reducing the overall current required to drive the AC coupled load. Power efficiency is measured as the total power delivered to the load divided by the power supplied to operate the device.

The means by which the clock propagation paths and DAC combiner paths achieve this effect is through use of a clock transmission line (15 of FIG. 4a) the tap-to-tap delay of which is closely matched to the tap-to-tap delay along the DAC combiner (the transmission line 422 in FIG. 4a), as described in more detail in conjunction with FIG. 5. Hence the delays are equalized so that clock delay added to DAC combiner delay at the load are equal for all DAC cells, where they progressively increase at the back termination. The progressive increase in delay for each tap has the effect of adding an incremental delay to the digital delays of the transversal filter as observed at the termination. For bandpass filter weighting, this will shift the pass band of the filter observed at the termination down in frequency with respect to the filter pass band observed at the load. If a sufficient size incremental delay is implemented in the clock lines and DAC combining line in relation to the transversal delays and output center frequency, a large enough frequency shift in the termination filter is implemented to suppress the signal in a pass band seen at the load filter output, which will be suppressed by the stop band of the termination filter.

The primary delay mechanism in the transversal filtering arrangement of the invention is provided by digital shift register 410 of FIG. 4a, where a whole sample clock cycle delay is incurred between each tap due to the digital operation alone. The total delay incurred at each tap also includes the analog delay of the data clock, which is matched by the delay of the umod clock, and the delay of the mode of propagation of interest on the DAC combining transmission line. In the forward mode of propagation, an incrementally increasing delay due to the clock path is accompanied by incrementally decreasing delay in the DAC combining path, toward the load. This produces a compensating effect for equalizing total analog path lengths at the load. In the reverse mode of propagation, the same incrementally increasing delay due to the clock path is accompanied by incrementally increasing delay in the DAC path toward the termination. Ideally, the transversal delay in the forward path is determined by the digital shift register delay, and the transversal delay in the reverse path is the sum of analog delay terms with the shift register delay.

When employing sigma-delta modulated patterns, the patterns contain in-band frequencies with low quantization noise and out-of-band frequency terms with high quantization noise. The production of RF power due to these high out-of-band high quantization noise components is suppressed by the filtering operation within the weighted array of DAC devices. The reconstructed signal appears as a voltage at the current sum nodes of each DAC cell. The product of the filtered voltage spectrum with the unfiltered sigma delta modulated current spectrum at each DAC cell represents the RF power generated by each DAC cell. Since the voltage components coinciding with out-of-band noise components are suppressed, the power spectrum determined as the branch current spectrum times the node voltage spectrum blocks production and consumption of power due to these terms. This combination is a highly preferred mode of operation over prior art D/A conversion schemes with respect to efficient conversion of high power signals directly from sigma-delta modulated signals. The production of power for desired signals within the pass band results since neither current nor voltage are suppressed for these components.

The summed analog currents propagated toward output port 422$_{o1}$ of summing node or transmission line 422 of FIG. 4a are ultimately applied to the output load represented as a resistor 426. Thus, the maximum output power at output port 422$_{o1}$ of transmission line 422 depends upon the number of DAC cells providing current inputs, the magnitudes of the DAC cell currents, and the impedance presented by the transmission line to the DAC cells. Those skilled in the art will recognize that the load represented by resistor 426 may represent the total impedance of a radiator antenna element which may be coupled within an array antenna. In order to reduce the effects of aliasing attributable to sampling effects, a filter may be interposed between the output port 422$_{o1}$ of transmission line 422 and the load 426. This filter's bandwidth should be at least equal to ½ the sampling rate of the DAC, while the filtering function implemented by the DAC is typically much narrower and can be arbitrarily programmed over the Nyquist band.

It should be noted that the term "between" and other terms such as "parallel" have meanings in an electrical context which differ from their meanings in the field of mechanics or in ordinary parlance. More particularly, the term "between" in the context of signal or electrical flow relating to two separate devices, apparatuses or entities does not relate to physical location, but instead refers to the identities of the source and destination of the flow. Thus, flow of signal "between" A and B refers to source and destination, and the flow itself may be by way of a path which is nowhere physically located between the locations of A and B. The term "between" can also define the end points of the electrical field extending between points of differing voltage or potential, and the electrical conductors making the connection need not necessarily lie physically between the terminals of the source. Similarly, the term "parallel" in an electrical context can mean, for digital signals, the simultaneous generation on separate signal or conductive paths of plural individual signals, which taken together constitute the entire signal. For the case of current, the term "parallel" means that the flow of a current is divided to flow in a plurality of separated conductors, all of which are physically connected together at disparate, spatially separated locations, so that the current travels from one such location to the other by plural paths, which need not be physically parallel.

If the characteristic impedance of the transmission line 422 of FIG. 4a is not suitable for direct application to the load 426 (in most applications, this is the case if the characteristic impedance is other than 50 ohms), an impedance transformer may be interposed between the output port 422$_{o1}$ of transmission line 422 and load 426. A block 428 represents the anti-aliasing filter, an impedance transformer, or both. A filter, an impedance transformer, or an impedance transformer in cascade with a filter may also be coupled between back port 422$o2$ of transmission line 422 and back termination Zerm, as suggested by block 429 of FIG. 4c.

FIG. 5 is a simplified block diagram of a representative Umod of set 416 of Umods of FIG. 4a at tap K and clock time delay index N. For definiteness, the Umod is designated 416$_2$. Umod 416$_2$ of FIG. 5 includes first and second multiplexers 510a and 510b. Multiplexer 510a includes two signal input ports 510*ai*1 and 510*ai*2, and a selected-signal output port 510*ao*, and also includes a state or control input port 510*ai*C. Input port 510*ai*2 is an "inverting" input port, by which is meant that the signal applied thereto, if selected for coupling to output port 510*ao*, is inverted when so coupled. Multiplexer 510*b* includes two data or signal input ports 510*bi*1 (noninverting) and 510*bi*2 (inverting), and a selected-signal output port 510*bo*, and also includes a state or control input port 510*bic*. Data or signal input port 510*bi*2 is an "inverting" input port, by which is meant that the signal applied thereto, if selected for coupling to output port 510*bo*, is inverted when so coupled. In FIG. 5, signal path $412_2$ includes two separate paths, designated $412_{2a}$ and $412_{2b}$, each of which carries one of the two delayed sigma-delta-modulated bits applied to the Umod $416_2$. The data on path $412_{2a}$ are designated $a_1(t-(n-k)T_s)$ and the data on path $412_{2b}$ are designated $a_0(t-(n-k)T_s)$. The signals on path $412_{2a}$ are applied "simultaneously" or "in parallel" to both input ports 510*ai*1 and 510*ai*2 of multiplexer 510*a*. The signals on paths $412_{2b}$ are applied "simultaneously" or "in parallel" to both input ports 510*bi*1 and 510*bi*2 of multiplexer 510*b*. This data represents the information which defines the tap delayed pass band modulation signals and, if appropriate, the various beams to be formed by the array antenna.

Figure 4B:
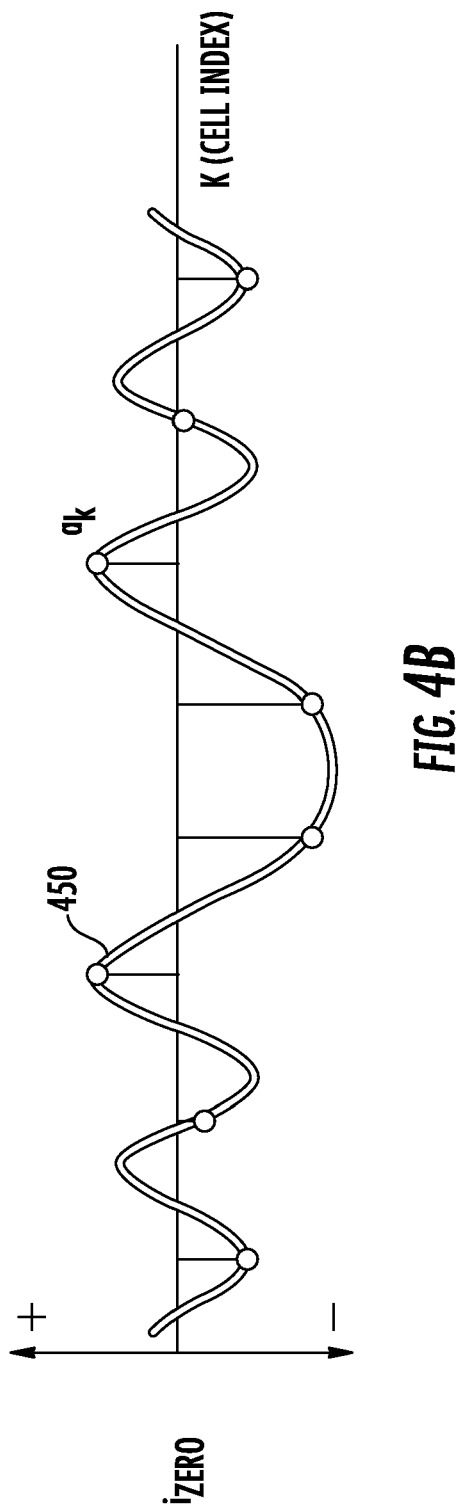
FIG. 4b is a plot representing the weighting applied to the ternary $\Sigma\Delta$ transversal filter DAC architecture plotted against cell index.

In FIG. 5, a static sign bit $sgn_k$, representing the sign of the filter weight applied to the particular tap of the transversal DAC array (TDAC), is applied by way of a dash-line signal path $512_2$ to multiplexers 510*a* and 510*b*, for setting the multiplexers to invert or noninvert the bits of the two-bit signal applied by way of paths $412_2$. While the applied signal on path $412_2$ varies, the inversion or noninversion of that applied signal is fixed by the static $sgn_k$ bit applied over path $512_2$. The signal coupled to the output ports 510*ao* and $510_{bo}$ of multiplexers 510*a* and 510*b*, respectively, is the applied signal as inverted or noninverted by the action of the "static" multiplexers. FIG. 4*b* a plot of the current as a function of position (cell index) within the array of DAC cells of set 420 of FIG. 4*a*. This plot illustrates that both positive and negative terms can be implemented. The static sign bit $sgn_k$ is selected to produce the weighting across the structure of FIG. 4*a* illustrated by plot 450 of FIG. 4*b*, which as illustrated is selected to represent a bandpass function, but which could represent other filter functions. The form of the weighting represented by plot 450 of FIG. 4*b* comprises two elements or factors, one of which is the sign (+ or −) of the weighting, and the other of which is the absolute amplitude, or deviation from zero current (i). As mentioned, the sign information for the weighting is provided to the Umod of FIG. 5 by way of path $512_2$. The amplitude information for the weighting is not provided to the Umod, but instead is provided to the DAC cells of set 420 of FIG. 4*a*.

The statically-selected inverted or noninverted applied signal appearing at the output ports 510*ao* and 510*bo* of "static" multiplexers 510*a* and 510*b*, respectively, of FIG. 5 are designated $b_1(t-(n-k)T_s)$ and $b_0(t-(n-k)T_s)$, respectively. The output signals $b_1(t-(n-k)T_s)$ of static multiplexer 510*a* are applied in parallel or simultaneously to the noninverting and inverting input ports $514a_{i1}$ and $514a_{i2}$, respectively, of "dynamic" multiplexer 514*a*. Similarly, the output signals $b_0(t-(n-k)T_s)$ of static multiplexer 510*b* are applied in parallel or simultaneously to the noninverting and inverting input ports $514b_{i1}$ and $514b_{i2}$, respectively, of "dynamic" multiplexer 514*b*. Dynamic multiplexers 514*a* and 514*b* also receive Umod clock signals by way of a path 516. The Umod clock signals applied to dynamic multiplexers 514*a* and 514*b* toggle the dynamic multiplexers, thereby imposing a Umod clock rate onto the signal at the outputs of the dynamic multiplexers 514*a* and 514*b*. The clocked signals appearing at the output port 514*ao* of dynamic multiplexer 514*a* and flowing on path 515*a* are designated $c_0(t-(n-k)T_s)$, and the clocked signals appearing at the output port 514*bo* of dynamic multiplexer 514*b* and flowing on path 515*b* are designated $c_1(t-(n-k)T_s)$ and both together represent the output signals of the Umod $416_2$ of FIG. 5. These output signals drive the two inputs to the ternary DAC cell $420_2$ of FIG. 4*a*. DAC cell $420_2$ responds by adding or sourcing two currents switched by the signals $c_1(t-(n-k)T_s)$ and $c_0(t-(n-k)T_s)$.

Also in FIG. 5, the Umod clock signal is designated as arriving from the adjacent cell. As illustrated in FIG. 5, the Umod clock signal propagates on a bus designated 415, and would in theory arrive at all Umods of set 416 of Umods of FIG. 4*a* simultaneously, if bus 520 were simply a short wire. However, according to an aspect of the invention, clock signals are adjusted to cause the currents injected into the traveling-wave current sum node 421 or transmission line 422 (FIG. 4*a*) to add in one direction of propagation, and to subtract or cancel in the other direction of propagation. This adjustment is performed by interposing delays in the clock signal paths. A major advantage of this clock delaying scheme is that little of the radio-frequency power produced by the digital-to-analog converter (DAC) cells $420_1$, $420_2$, $420_3$, ..., $420_N$ of set 420 of DAC cells of FIG. 4*a* is lost or wasted as unwanted power dissipation in back termination 424, and thus most of the power produced by the DAC cells becomes available at the output load. In order for the DAC current signals which are injected into the various input ports $422i_1$, $422i_2$, $422i3$, ..., $422iN$ of transmission line 422 to preferentially add toward output port $422_{o2}$ and cancel toward port $422_{o1}$, the currents applied to the input ports $422i_1$, $422i_2$, $422i3$, ..., $422iN$ of transmission line 422 must progress in phase from port to port in the same manner as the phase progression in transmission line 422. This, in turn, requires that the clocking of the registers of set 410 and the clocking of the Umods progress in phase to match the phase progression of the transmission line. This is readily accomplished by making the data clock line 414 (FIG. 4*a*) a transmission line instead of a simple conductor, and similarly making the Umod clock line 415 a transmission line, each matched to the phase of the corresponding portion of transmission line 422. The transmission-line characteristic of data clock line 414 is suggested in FIG. 4*a* by the strip representation, and similarly the transmission-line characteristic of the Umod clock line 415 is suggested in FIG. 5 by the strip representation.

As described in conjunction with FIG. 4*a*, the DAC current output dynamically switches among positive current, zero current, and negative current states in response to the digital wave shaped signal. The digital data stream controls the current value dynamically where each DAC cell receives delayed digital signals, through the amplitude sign through the shift register, the sign and amplitude weighting means 418, 420, and 430 uniquely control the weight value applied to each DAC cell. Finally, the Umod blocks of set 416 control a common sign across all cells at a switching rate that is a multiple of the switching rate due to the data, and enable generation of frequency output higher than that provided by the clock rate. The structure contains all the necessary elements of (a) a transversal tap delay line filter where the delay means are digital shift registers, (b) weighting means include sign logic and trimmable DAC current, and (c) an analog combiner.

Figure 6:
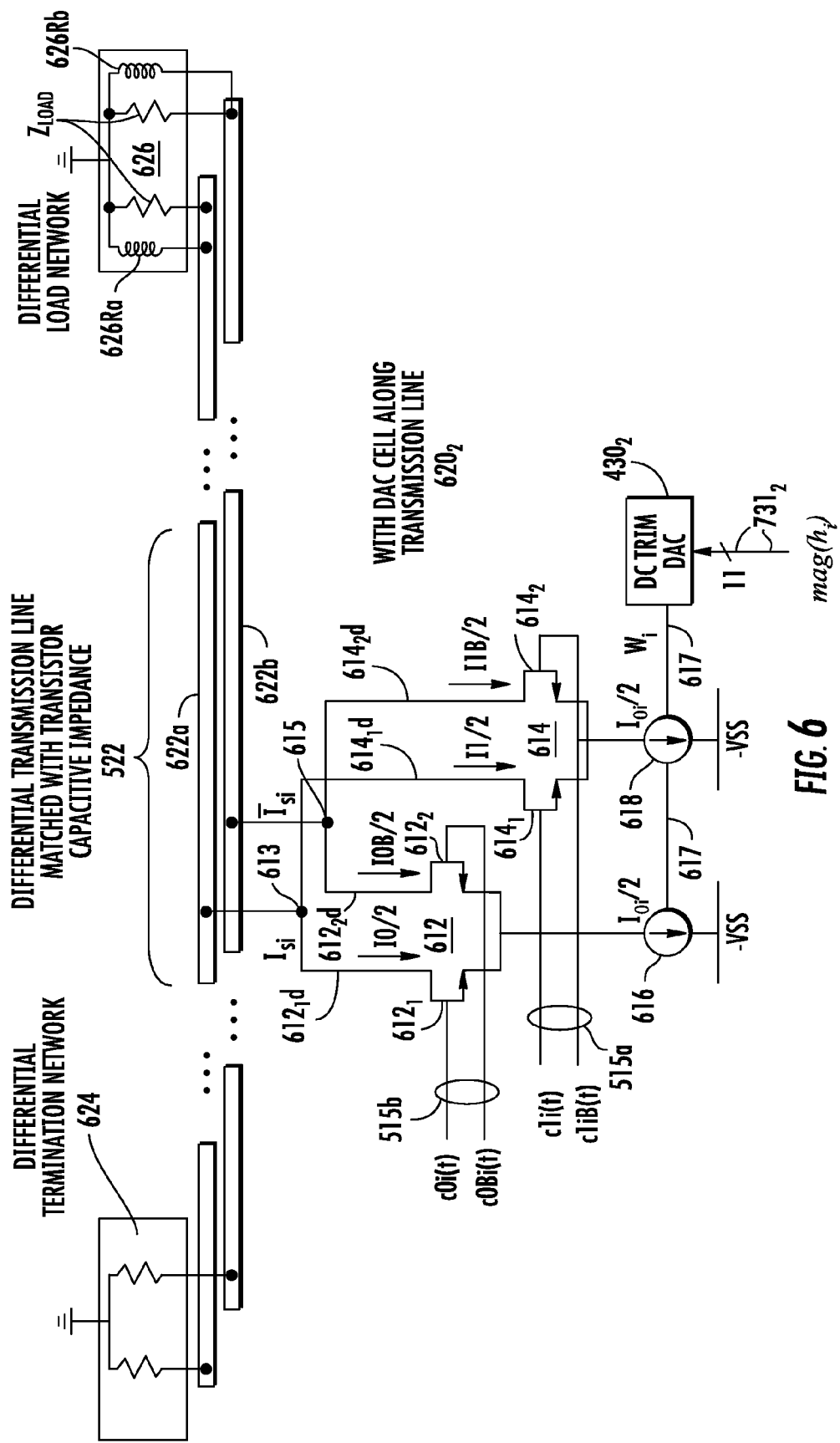
FIG. 6 is a simplified diagram in block and schematic form illustrating details of one embodiment of a DAC cell of FIG. 4a employing differential circuit techniques, and in which differential DAC input signals control differential DAC current signals that are combined on a differential transmission line.

FIG. 6 is a simplified drawing in schematic and block form, illustrating details of a DAC cell of set 420 of DAC cells of FIG. 4*a*. For definiteness, DAC cell $420_2$ is represented, but designated as $620_2$ so as to indicate certain differences The specific embodiment of FIG. 6 is differential, in that the ordinary transmission line 422 of FIG. 4a becomes a differential transmission line 522, the back termination 424 becomes a differential back termination 624, and the load 426 is represented as differential load 626. The DAC cell $620_2$ of FIG. 6 receives ternary signals $c_1(t-(n-k)T_s)$ and $c_0(t-(n-k)T_s)$ from the UMOD of FIG. 5. However, since the ternary signals $c_1(t-(n-k)T_s)$ and $c_0(t-(n-k)T_s)$ arrive (by way of paths 515a and 515b) at DAC cell $620_2$ in differential form, they are designated c1i(t), c1iB(t), c0u(t), and c0iB(t). In FIG. 6, a direct trim signal is generated by DC trim DAC $430_2$, already described in conjunction with FIG. 4a. The trim data signal mag($h_t$) is applied in common to control the magnitudes of currents $I_0$ produced by current sources 616 and 618, which are connected to a common voltage source $-VSS$. The currents produced by sources 616 and 618 are equal, which is to say that each current source 616, 618 produces current $I_{01}/2$. Current source 616 applies current to a differential transistor (which may be bipolar, FET, or any other type) switch arrangement 612, and current source 618 applies current to a differential transistor switch 614. Each differential switch 612, 614 includes a source-coupled FET pair. More particularly, switch 612 includes FETs $612_1$ and $612_2$, which have their sources coupled together and to current source 616. Switch 614 includes FETs $614_1$ and $614_2$, which have their sources coupled together and to current source 618. Switch transistors 612 and 614 switch the currents applied to their joined sources under the control of the digital signals c1i(t), c1iB(t), c0u(t), and c0iB(t). When FET $612_1$ of switch 612 is rendered conductive, and FET $612_2$ nonconductive, current I0/2 flows through drain conductor $612_1$d and no current flows through drain conductor $612_2$d. When FET $612_2$ is rendered conductive and FET $612_1$ nonconductive, current I0/2 flows through drain conductor $612_2$d. Similarly, when FET $614_1$ of switch 614 is rendered conductive and FET $614_2$ nonconductive, current I0/2 flows through drain conductor $614_1$d and no current flows through drain conductor $614_2$d. When FET $614_2$ is rendered conductive and FET $614_1$ nonconductive, current I0/2 flows through drain conductor $614_2$d.

Drain current paths $612_1$d and $614_1$d of FIG. 6 are joined at a joining or summing point 613, and drain current paths $612_2$d and $614_2$d are joined at a joining or summing point 615. As a result, the drain currents produced by FETs $612_1$ and $614_1$ added at joining point 613 to produce switched ith current Isi, and the drain currents produced by FETs $612_2$ and $614_2$ add at joining point 615 to produce switched ith current Īsi. Current Isi is applied to strip conductor 622a of differential transmission line 622, and current Īsi is applied to strip conductor 622b. As also illustrated in FIG. 6, the back termination 624 is differential, and the load 626 is differential. The differential termination and load may be in the form of networks which include filters andor impedance transformers. Those skilled in the art know that the termination networks 624, 626 may need shunt or parallel inductors (also known as chokes) to drain the current applied by the DAC cells from the strip conductors of the transmission line 622. Representative shunt inductors 626Ra and 626Rb are illustrated as being connected in load network 626 between ground (or other reference voltage) and strip conductors 612a and 612b, respectively.

In operation of the DAC cell $620_2$ of FIG. 6, the switch control signals c0i(t), c0iBi(t) and c1i(t), c1iB(t) control or modulate the flow of current from the current sources 616, 618 to the two transmission lines 622a, 622b, for combining the modulated current signals in the differential mode. The possible current states include a fully ON or maximum state, an intermediate state, and a zero-current or OFF state. It should be noted that the sum currents flowing from joining points 613 and 615 to strip conductors 622a and 622b, respectively, are complementary to each other. Thus, when the current applied to 622a is at a maximum, the current applied to strip 622b is at a minimum, and conversely when the current applied to strip 622a is at a minimum, the current applied to strip 622b is at a maximum. Also, when the current applied to strip 622a is at its middle state, the current applied to strip 622b is also at its midpoint. Thus, the total current flowing in the common mode in differential transmission line 622 is constant, but the differential current on strips 622a and 622b varies.

Figure 7:
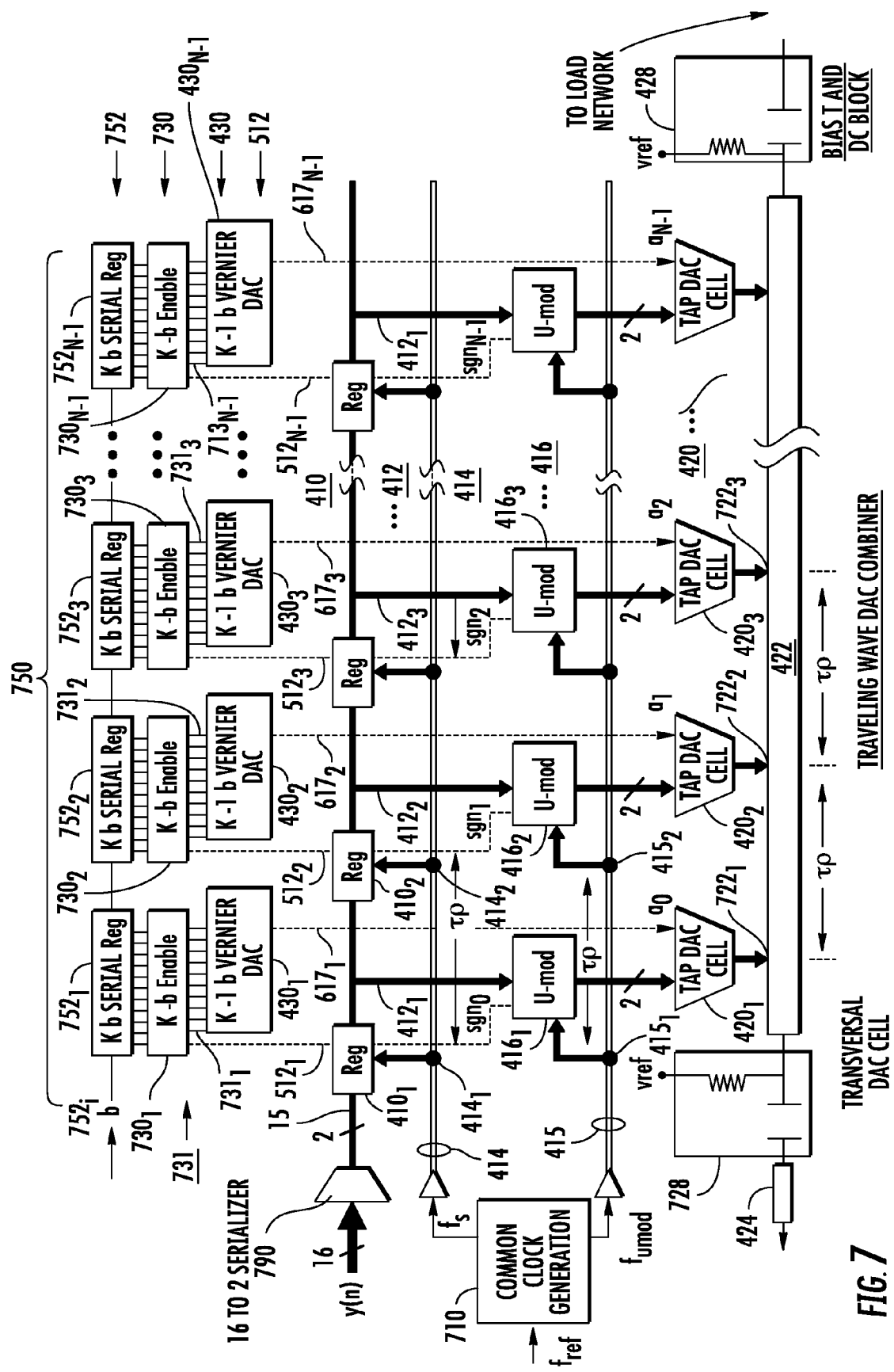
FIG. 7 is another representation of the arrangement of FIG. 4a, illustrating some details related to the generation of supporting signals, including a distribution network for weight control signals to an array of DAC cells, and a serial shift register and a row of trimming DAC(s) which together produce binary sign control signals and analog amplitude control signals for setting the weight values of FIG. 4b via a single bit data interface.

FIG. 7 illustrates some details of the arrangement of FIG. 4a. In FIG. 7, elements corresponding to those of FIG. 4a are designated by like alphanumerics. As illustrated in FIG. 7, the Sigma-Delta quantized information y(n) is applied by way of path 15 to shift register array 410, and delayed signal is generated at taps of set 412. A common clock generator block 710 receives reference clock $f_{ref}$ and generates the shift-register clock $f_s$ on strip conductor 414 and Umod clock $f_{Umod}$ on strip conductor 415. Certain delay intervals τ associated with the various transmission lines are identified. More particularly, the delay $\tau_p$ occurs between the tap point or current injection point $722_1$ of DAC cell 420, and the next adjacent tap point or current injection point $722_2$ of DAC cell $420_2$, and the same delay $\tau_p$ occurs between the tap point or current injection point $722_2$ of DAC cell $420_2$ and the next adjacent tap point or current injection point $722_3$ of DAC cell $420_3$.

The corresponding delay $\tau_p$ occurs in FIG. 7 between adjacent tap points on shift register transmission line 414 and between adjacent tap points on Umod clock line 415. More particularly, the delay between tap point $414_1$ on shift register clock line 414, for shift register $410_1$, and tap point $414_2$ for shift register $410_2$ is $\tau_p$. Similarly, the delay between tap point $415_1$ on Umod clock line 415 and the next adjacent tap point $415_2$ is also $\tau_p$. Thus, the delay between adjacent tap points on the current summing transmission line 422, the shift register clock transmission line 414, and the Umod clock transmission line 415 are all the same, and are equal to $\tau_p$. The value of $\tau_p$ tends to add to the transversal delays, and therefore changes the periodic nature of the filter. An increase in $\tau_p$ and increase in delay creates a shift in frequency at the back port.

FIG. 7 illustrates a serializer 790, which is optional. The serializer 790, illustrated as a 16-to-2 serializer, provides a way to transmit high-speed data from a remote sigma-delta modulator arrangement such as that of FIG. 2 for those cases in which only relatively low-speed parallel paths are available. The serializer converts the parallel data into higher-clock-rate ternary data for application to path 15.

Also in FIG. 7 is a representation 750 of an integrated-circuit arrangement for distributing the control of coefficients which are applied to the Umods of set 416 and to the DAC cells of set 420. More particularly, arrangement 750 includes a cascade 752 of serial registers $752_1, 752_2, 752_3, \ldots, 752_{N-1}$ which receive a serially formatted finite 1 b sign and weight control signal at an input port 752i. It should be noted that there are N+1 stages, or taps, in FIG. 4a and N stages, or taps in FIG. 7, where the tap index starts at 0 in both figures. The serially formatted signal on port 752i is equal in length to that of the total shift register. Each tap employs a K bit long shift register and for N taps the total serial signal is N·K bits long. This is entered into the shift register by N·K clock cycles. Each serial shift register delay block produces a shift register pattern which is applied to an associated enable block of a set 730 of enable blocks. Thus, the outputs of shift register $752_1$ are applied in parallel to the inputs of enable block $730_1$, the outputs of shift register $752_2$ are applied in parallel to the inputs of enable block $730_2$, the outputs of shift register $752_3$ are applied in parallel to the inputs of enable block $730_3, \ldots$, and the outputs of shift register $752_{N-1}$ are applied in parallel to the inputs of enable block $730_{N-1}$. The enable blocks of set 730 perform two functions. First, they generate the sign bits ($sgn_i$) for application over the paths of set 512 of paths to the Umods of set 416 of Umods. Second, they generate data patterns which are applied by way of set of paths 731 to the vernier DACs of set 430 of DACs, to cause the DACs to produce the amplitude control signals for application by way of paths of set 617 to the DAC cells of set 420. More particularly, enable block $730_1$ produces amplitude control signals on paths $731_1$ for application to vernier DAC $430_1$, enable block $730_2$ produces amplitude control signals on paths $731_2$ for application to vernier DAC $430_2$, enable block $730_3$ produces amplitude control signals on paths $731_3$ for application to vernier DAC $430_3, \ldots$, and enable block $730_{N-1}$ produces amplitude control signals on paths $731_{N-1}$ for application to vernier DAC $430_{N-1}$. During a processing dwell, the digital controls applied for DAC cell weighting are provided by the enable blocks and are simultaneously updated to represent shift register value through an enable clock signal connect each enable block. During the dwell the DAC operates with fixed or static weight control signals.

Figure 8:
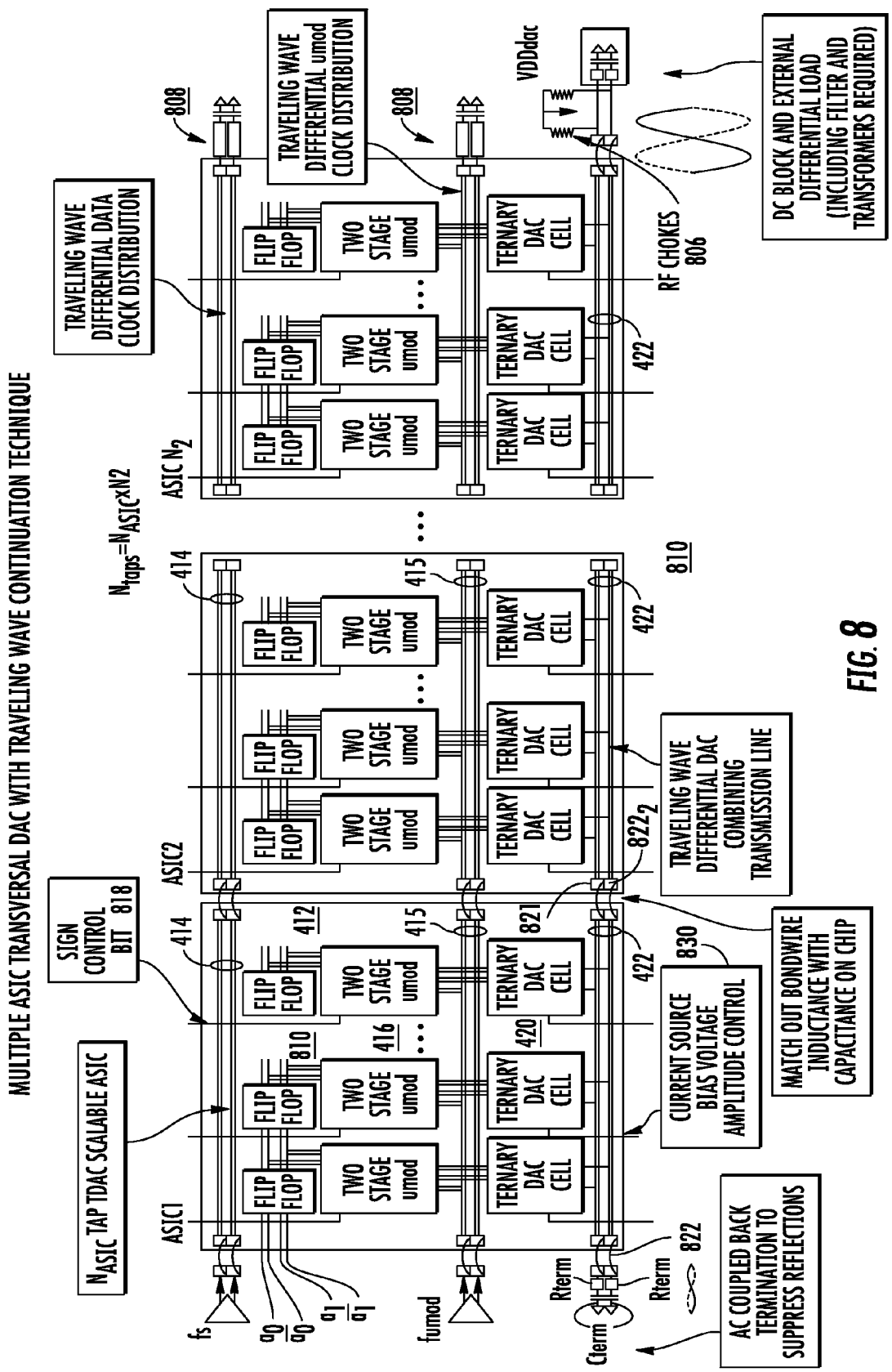
FIG. 8 shows some details of a particular Application-Specific Integrated Circuit (ASIC) embodiment of a transversal DAC for expanding the number of taps beyond that of a single integrated circuit unit, and showing a method for extended the transversal DAC to multiple integrated circuit units where ASIC layout supports a unidirectional flow of clock signals, data and output DAC combining signals, and also showing a traveling-wave transmission line flow for the DAC output and clock input signals is maintained across chip to chip interfaces.

FIG. 8 shows some details of a particular Application-Specific Integrated Circuit (ASIC) embodiment of a transversal DAC using traveling-wave continuation as generally described above. In FIG. 8, a set 810 of a plurality of ASICs, namely ASIC1, ASIC2, ..., ASICN$_2$ are arrayed in a linear row. Each ASIC implements $N_{ASIC}$ taps and the number of ASICs connected in series is $N_2$. The total number of taps is then $N_{TAPS}=N_{ASIC} \times N_2$. The term "$N_{ASIC}$ Tap TDAC Scalable ASIC" refers to an ASIC that is designed to be combined serially in a larger multichip array where the number of taps per ASIC is $N_{ASIC}$. Each ASIC of set 810 includes three differential transmission lines, namely the shift register or data clock fs transmission line 414, the Umod clock fUmod transmission line 415, and the current combining traveling-wave transmission line 422. Each ASIC of set 810 also includes a set 810 including a plurality of flip-flops used as shift registers, a set 416 including a like plurality of Umods, and a set 420 including a like plurality of ternary DAC cells. The shift registers define a plurality of tap points of a set 412 if tap points. The shift registers receive digital data a0 and $\overline{a0}$ and a1 and $\overline{a1}$ from a source, not illustrated in FIG. 8, and couple them to the set 416 of two-stage Umods by way of the set of taps 412, with delays set by the inter-tap time. The Umods receive clock from transmission line 415, with delays selected as described above. The Umods drive the set 420 of ternary DAC cells. The DAC cells of set 420 feed the differential current summing transmission line 422, with delays equal to the inter-tap delays of clock transmission lines 414 and 415. Each ASIC of set 810 makes some off-ASIC connections. For example, each ASIC of set 810 makes connections 818 for receipt of sign control bits. Similarly, each ASIC of set 810 makes connections 830 for receipt of current source vernier amplitude control.

ASIC1 of FIG. 8 is at one end (an "input" end) of the array 810 of ASICs. For this reason, ASIC1 makes connections to certain external elements. In particular, the differential transmission line 422 makes connection by way of bond wires 822 to a back termination including a pair of reflection-suppressing resistive terminations designated $R_{term}$, each of which is connected in "AC coupled" or coupled in series with a capacitor $C_{term}$. Each ASIC of array 810 of ASICs of FIG. 8 makes at least one set of connections to another, next adjacent ASIC. For example, ASIC1 makes connection of at least the three differential transmission lines 414, 415, and 422 to the corresponding transmission lines of the next adjacent ASIC, namely ASIC2. These inter-ASIC connections are made by bond wires, such bond wires $822_2$, extending between bonding pads, such as bonding pads 821, on the ASICs. Proper selection of the inductance of the bond wire in conjunction with the capacitance exhibited by the bonding pads tends to form a low-pass filter structure, which, properly dimensioned, ideally has a cut-off frequency above the operating frequency of the apparatus, so does not adversely affect the performance.

The last or "output" ASIC of array 810, in addition to connections to an adjacent ASIC, also makes off-array connections. In particular, ASIC $N_2$ makes connection by way of DC-blocking matched differential terminations 808, which include a "central" ground connection. Also, ASIC $N_2$ makes connection from one end or port of its combining transmission line 422 to a pair of inductors or chokes designated generally as 806. The ends of the pair of inductors 806 remote from the transmission line are connected to ground or other reference potential for current return purposes. That end of transmission line 422 of ASIC $N_2$ to which chokes 806 are connected is also connected to a differential DC-blocked load designated 826, which, as mentioned, may include an antenna or radiator, and may also include a suppression filter and or an impedance transformer.

The invention enables generation of signals within in a Nyquist band, which is selected through the Umod clock frequency and the reconstruction bandpass filter with bandwidth equal to ~fs/2, where fs is the sampling frequency, or clock frequency of the shift register. This Nyquist band corresponds to an operational band over which narrower bandwidth modulated signals can be generated. The transversal filter's narrower bandwidth will reconstruct the pass band signals from the digital inputs at a center frequency corresponding to both the sigma delta pass band center frequency and the transversal bandpass filter's center frequency. According to an application of the invention, a digital transmit array antenna composed of multiple radiator elements and multiple sigma delta transversal DAC transmit signal generators can enable the formation of multiple independent beams through superposition of independent signals in the pass band. By properly controlling the phase, amplitude and delay of each of these signals as a function of its position on the array, transmit beams can be formed. Normally, if an amplifier is used, distortion terms can result, which would require reduction of the output power until the distortion terms are small enough for proper transmission. Given the inherent linearity of the DAC under full amplitude conditions, the generation of multiple signals can be obtained without reduction of the peak voltage signal. This is due to the property that the transmit signal results form the array of fully on or full off current switches, thereby avoiding the nonlinearities associated with signal amplification.

FIGS. 9a1, 9a2, 9b1, 9b2, 9c1, 9c2, 9d1, 9d2, 9e1, 9e2, 9f1, and 9f2 together generally represent Umod waveforms for upconverting the input data to higher-order Nyquist bands. The Umod clock frequency $f_{umod}$ is Mfs, or M times the data clock frequency fs. In general, these FIGURES illustrate possible Umod functions which represent idealized waveforms produced from the DAC cells with AC coupling, so that the middle state correspond to 0, and full current can take on +1 or −1 values. More specifically, FIG. 9a1 is a plot 910 of ternary value, with a range of −2 to +2, versus digital pattern sample index, for a Umod frequency Mfs, where the clock multiplier is M=1, and FIG. 9a2 is a plot 912 of response in dB versus normalized frequency for the pattern index of FIG.

9*a*1. Plot 912 shows that the amplitude/frequency response exhibits two maxima at frequencies of 1 Hz and 3 Hz, with a null at 2 Hz. FIG. 9*b*1 is a plot 914 of ternary value (range of −2 to +2) versus digital pattern sample index for a clock multiplier of M=1.5. FIG. 9*b*2 plots response 916 in dB versus normalized frequency for the pattern index of FIG. 9*b*1. The illustrated response shows a broad maximum at 1.5 Hz, with nulls at 0.5 Hz and in the range of 2.5 to 3.5 Hz. FIG. 9*c*1 is a plot 918 of ternary value versus digital pattern sample index for a clock multiplier of M=2. FIG. 9*c*2 is a plot 920 of response in dB versus normalized frequency for the pattern index of FIG. 9*c*1. The normalized frequency response in plot 920 has peaks at 0.5 and 2 Hz, and nulls at 1 and 3 Hz. FIG. 9*d*1 is a plot 922 of ternary value versus digital pattern sample index for a clock multiplier of M=2.5, and FIG. 9*d*2 is a plot 924 of response in dB versus normalized frequency for the pattern index of FIG. 9*d*1. Plot 924 shows a major peak at 2.5 Hz, and nulls at 0.5, 1.5, and 3.5 Hz. FIG. 9*e*1 is a plot 926 of ternary value versus digital pattern sample index for a clock multiplier of M=3, and FIG. 9*d*2 is a plot 928 of response in dB versus normalized frequency for the pattern index of FIG. 9*d*1. Plot 928 exhibits a major peak response at 3 Hz, with nulls at 0, 1, 2, and 4 Hz. FIG. 9*f*1 is a plot 930 of ternary value versus digital pattern sample index for a clock multiplier of M=3.5, and FIG. 9*f*2 is a plot 932 of response in dB versus normalized frequency for the pattern index of FIG. 9*f*1. Plot 932 exhibits a major peak at 3.5 Hz, and nulls at 0.5, 1.5, and 2.5 Hz.

The Nyquist band reconstruction function shown in FIGS. 9*a*1, 9*a*2, 9*b*1, 9*b*2, 9*c*1, 9*c*2, 9*d*1, 9*d*2, 9*e*1, 9*e*2, 9*f*1, and 9*f*2 can be thus controlled by the selection of the Umod clock frequency. Given a ternary data value in the shift register, each DAC cell (also referred to as a transversal DAC tap) modulates its current with the Umod function. The multiplexing Umod logic does this through a high speed dynamic sign modulation. This is common across all DAC cells, except as to the delays incurred on the Umod clock distribution transmission line. Also in cascade with the dynamic sign modulation is a static sign that is unique to each DAC cell.

The emphasized frequency for a particular example of multiplier M is shown in FIGS. 10*a*1, 10*a*2 and 10*b*1, 10*b*2. FIG. 10*b*2 represents a particular Umod function in which the operational band requires selection by an antialiasing filter in the load network. As can be seen in the example there are two possible image bands one can select with this fixed filter. FIG. 10*a* shows a pattern 1010 resulting in the normalized spectrum 1014 of FIG. 10*a*2. The spectrum 1012 has peaks at normalized frequencies of 0, 1.5, 2.5, and 3.5 Hz, and nulls at 1, 2, 3, and 4 Hz, and can be used to pass spectral band 1014 as though it were a low-pass filter. By contrast, the pattern 1020 of FIG. 10*b*1 produces a spectral band designated 1024 including negative and positive image components. The peak of spectrum 1022 can be used to bandpass spectrum 1024.

Figure 11:
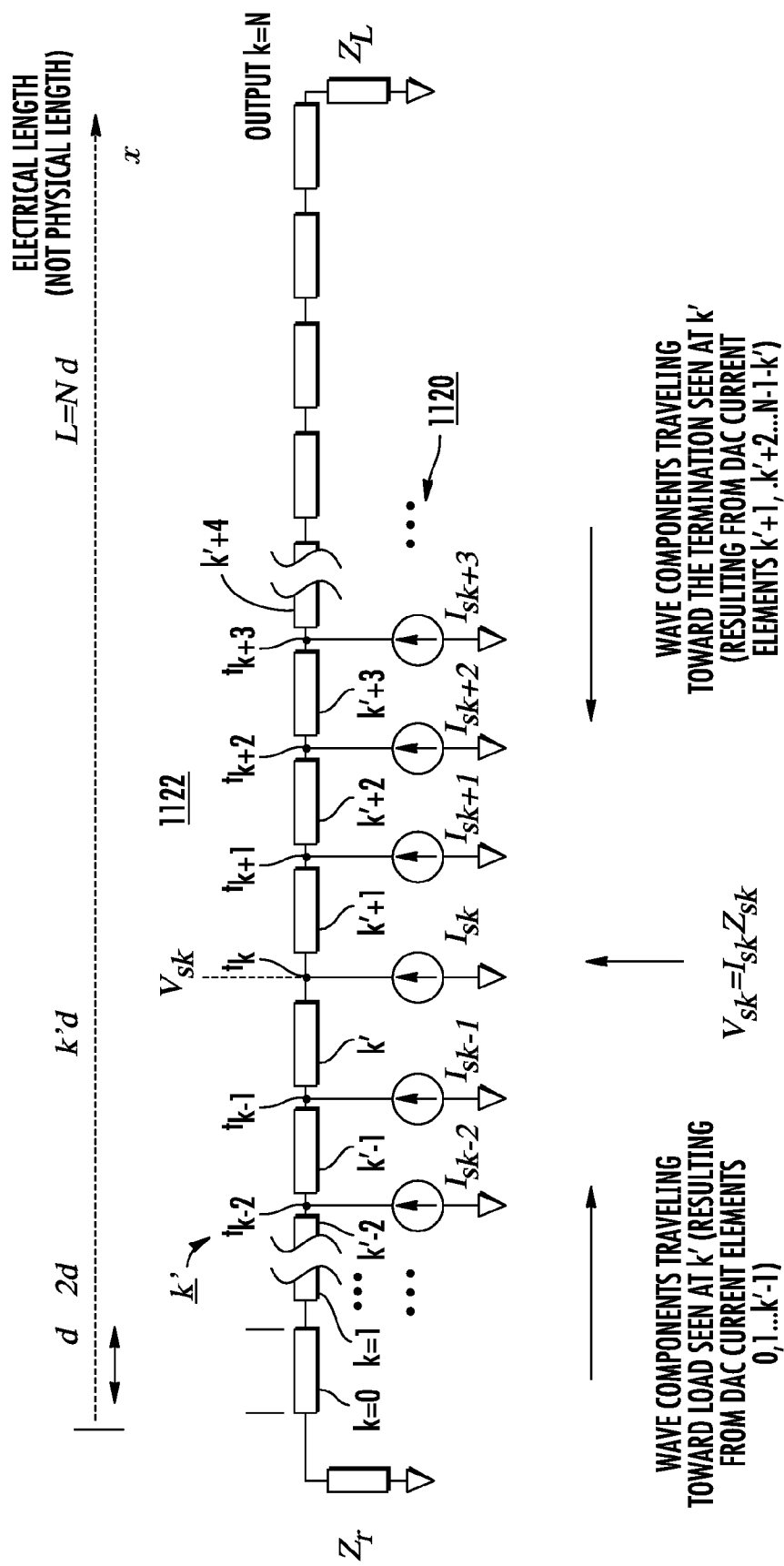
FIG. 11 shows an equivalent actively loaded transmission line representing the DAC traveling wave transmission line and current sources through a DAC cell cascade or array of DAC elements, and load and back terminations.

To enable higher power operation than might otherwise be possible, the summing transmission line (422 of FIG. 4*a*) employs a relatively low characteristic impedance, Z0, which can provided a higher maximum power when operated near the breakdown voltage of the switching transistors. Also, to enable efficient combining, the current that would normally flow into both load and termination impedances are controlled to ensure that little power is consumed in the back termination and due to conversion artifacts in the load. FIG. 11 shows a equivalent transmission line 1122 including a cascade or array of elements designated generally as k', where the illustrated cascade includes elements k'=0, k'=1, k'=2, k'−1, k', k'+1, k'+2, k'+3, k'+4, . . . . The connection of two elements of transmission line 1122 defines a tap point or "port". More particularly, the connection of element k'−2 with element k'−1 defines a tap point $t_{k-2}$, the connection of element k'−1 with element k' defines a tap point $t_{k-1}$, the connection of element k' with element k'+1 defines a tap point $t_k$, the connection of element k'+1 with element k'+2 defines a tap point $t_{k+1}$, the connection of element k'+2 with element k'+3 defines tap point $t_{k+2}$, and the connection of element k'+3 with element k'+4 defines a tap point $t_{k+3}$. An array of high impedance current sources . . . , Isk−2, Isk−1, Isk, Isk+1, Isk+2, and Isk=3, . . . , are connected to the transmission line 1122 at "ports" or taps $t_{k-2}, t_{k-1}, t_k, t_{k+1}, t_{k+2},$ and $t_{k+3}$, respectively. The output of transmission line 1122 is at k=N, and an impedance $Z_L$ is coupled to the output. A like termination $Z_L$ is coupled to that end of transmission line 1122 remote from the output. The electrical length (as opposed to physical length) of transmission line 1122, from end to end, is given as L=Nd, where N refers to the index, and d refers to the electrical length of a single transmission line element. This description includes a current source at position k on the transmission-line element array that produces current complex spectrum $I_{sk}$ as a result of its switching operations. One can define the voltage at node k as the sum of terms defined by the component due to current source k, a component due to the set of current sources at positions k'=0 to k−1 and another component due to the set of current sources at positions k'=k+1 to N. The solution on the traveling wave line with current sources at each position index, k=k' is given by $$V_k = I_{sk}Z_{sk} + \sum_{n=0}^{k-1} V_{sLn}(k-n) + \sum_{m=k+1}^{N-1} V_{sTm}(m-k)$$

$$x_1 = (k-n)d, \; x_2 = (m-k)d$$

$$V_{sLn}(k-n) = I_{sn}Z_{sn}e^{-\gamma(k-n)d}\frac{1-\Gamma_L e^{-2\gamma(L-nd-(k-n)d)}}{1-\Gamma_L\Gamma_T e^{-2\gamma(L-nd)}},$$

$$n = 0, \ldots, k-1$$

$$V_{sTm}(m-k) = I_{sm}Z_{sm}e^{-\gamma(m-k)d}\frac{1-\Gamma_T e^{-2\gamma(md-(m-k)d)}}{1-\Gamma_L\Gamma_T e^{-2\gamma(md)}},$$

$$m = k+1, \ldots, N$$

where:

k is the DAC cell index

L is a subscript denoting Load n is a shift variable for contributing terms between k and the load end m is a shift variable for contributing terms between k and the termination s is subscript denoting that terms result from individual DAC current switches T is a subscript denoting Termination $V_k$ is the total voltage at node k along synthetic transmission line $I_{sk}$ is the current signal from current switch k $Z_{sk}$ is the impedance of current switch $x_1$ is the represented distance from point k toward the load by summation index $x_2$ is the represented distance from point k toward the load by summation index γ is the exponential factor incorporating an imaginary component with phase velocity which multiplies the distance to produce a phase change as a function of distance and frequency, and may also include a real component to represent loss as a function of distance and frequency;

$\Gamma_L$ is the load reflection coefficient relative to the characteristic impedance of the transmission line; and $\Gamma_T$ is the back termination reflection coefficient relative to the characteristic impedance of the transmission line.

The first sum terms of the above equation defining $V_k$ correspond to the combined voltage wave traveling toward the load, $\text{Sum}_{n=0 \text{ to } k-1} V_{sLn}(k-n)$, where the load is set at position k=N. The second term corresponds to the combined voltage wave traveling toward the termination, $\text{Sum}_{m=k+1 \text{ to } N} V_{sTm}(m-k)$, where the termination is set at position k=0. The total impedance of the transmission line observed at position k is $Z_{sk}$ and is due to both directions of the line. The terms $\Gamma_L$, and $\Gamma_T$ correspond to the load and termination reflection coefficients in relation to the transmission line characteristic impedance. This description is applicable to lossy lines where $\gamma=\sigma+j\beta$. The line loss exponential factor $\sigma\sim 0$ is assumed for best operation. The propagation on the line is then determined by $j\beta d=j\omega\tau_p$ where the propagation delay $\tau_p$ is due to the phase velocity $v_p$ over line segment of length d.

Solving for Vk, the following is obtained:

$$V_k = I_{sk}Z_{sk} + \sum_{n=0}^{k-1} \frac{Z_0}{2} I_{sn} e^{-\gamma(k-n)d} + \sum_{m=k+1}^{N-1} \frac{Z_0}{2} I_{sm} e^{-\gamma(m-k)d}$$

$$I_{sk}(\omega) = W_k e^{-j\omega kT_s} Y_r(\omega),$$

where $Y_r(j\omega) = H_{r,\text{umod}}(\omega) \sum_{n'=-\infty}^{\infty} Y(\omega - n'\omega_s)$ $$V_k = \frac{Z_0}{2} Y_r(\omega) H_{TDAC,k}(\omega)$$

$$H_{TDAC,k}(\omega) =$$

$$W_k e^{-j\omega kT_s} + \sum_{n=0}^{k-1} W_n e^{-j\omega(nT_s+\tau_p(k-n))} + \sum_{m=k+1}^{N-1} W_m e^{-j\omega(mT_s+\tau_p(m-k))}$$

Where $H_{TDAC,k}(\omega)$ is the effective voltage transfer function at node k due to the transversal distribution of weighted current sources along the transmission line. The transversal filter weights, as shown, are $W_k$, which are derived from a discrete-time-filter prototype. Multiplying each term is a delay phase factor, where respectively, the factors are $-j\omega kT_s$, $-j\omega(nT_s + \tau_p(k-n))$, and $-j\omega(mT_s+\tau_p(m-k))$ the component resulting from the sampling clock delay period Ts is evident and propagation delay factors along the transmission line are represented by $\tau_p$. For a uniform spacing a uniform delay can be added to each tap, thereby changing the transversal delay. The output end of the transmission line corresponds to k=N in the above equation. Hence, the output at the load end is given by $$H_{TDAC,N}(\omega) =$$

$$\sum_{n=0}^{N-1} W_n e^{-j\omega(nT_s + n\Delta\tau_{clk} + \tau_p(N-n))} = e^{-j\omega\tau_p N} \sum_{n=0}^{N-1} W_n e^{-j\omega(nT_s + \tau_{p\varepsilon n})}$$

$\Delta\tau_{clk} = \tau_p + \tau_{p\varepsilon,k}$, where $\tau_{p\varepsilon,k}$ = delay matching error The above voltage transversal filter transfer function at the load includes the effects resulting from weights and delays. The delay effects include the phase factors for the shift register, determined from sample delay Ts (which is the sample clock period), clock transmission line delay $\Delta\tau_{clk}$ and DAC combining line delay $\tau_p$. As shown above the clock transmission line delay $\Delta\tau_{clk}$ is set to match the delay of the DAC combining transmission line $\tau_p$, within an allowable error term. For the voltage spectrum at the termination the voltage spectrum at k=0 is determined. The resulting voltage transversal filter transfer function at the back termination is given by $$H_{TDAC,0}(\omega) =$$

$$\sum_{m=0}^{N-1} W_n e^{-j\omega(mT_s + m\Delta\tau_{clk} + \tau_p m)} = e^{-j\omega\tau_p N} \sum_{n=0}^{N-1} W_n e^{-j\omega(nT_s + n2\tau_p + \tau_{p\varepsilon n})}$$

The primary difference between the output load and back termination transfer functions is the additional phase factor due to delay $2\tau_p$. This effectively reduces the periodic frequency due to the total transversal delay realized. This also effectively shifts the entire periodic transfer function down where the frequency shift is proportional to the frequency being generated. Primarily, the coefficients $W_k$ are derived from a prototype filter that defines a discrete-time filter with either a bandpass characteristic or with multiple pass bands. They reconstruct corresponding sigma-delta modulated signals where the desired modulated signals are present within each pass band. Assuming sufficient delay is present at each tap with sufficient matching, the termination filters will be shifted below the sigma delta pass band, where only quantization noise is present. The inband signal will then be in a frequency sidelobe of the termination filter, thereby reducing overall RF power consumed. This translates into reduced current required to achieve power delivered to the load, and thus, will improve efficiency by a significant factor (such as 2×).

Figure 12A:
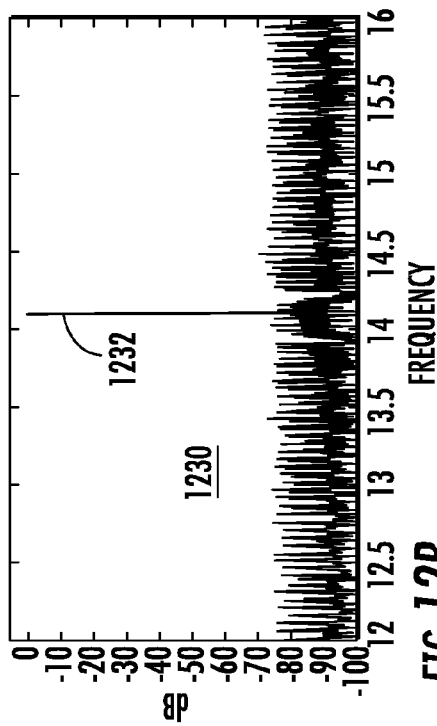
FIGS. 12a and 12b are representations of the set of parallel transmission lines of FIG. 4a, showing clock flow in the forward and reverse directions, respectively.
Figure 12B:
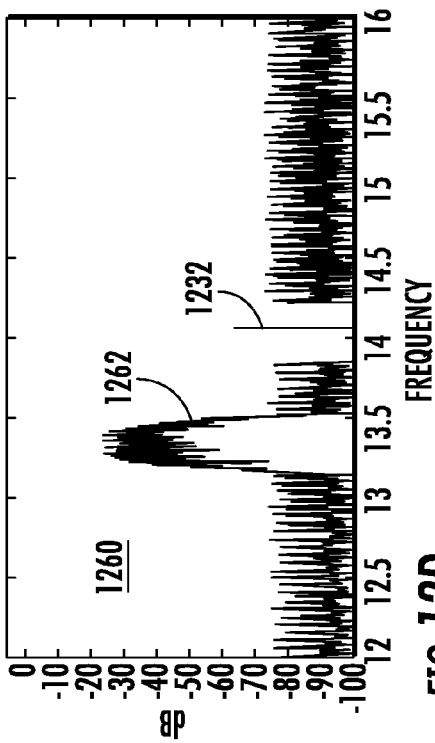
Figure 12C:
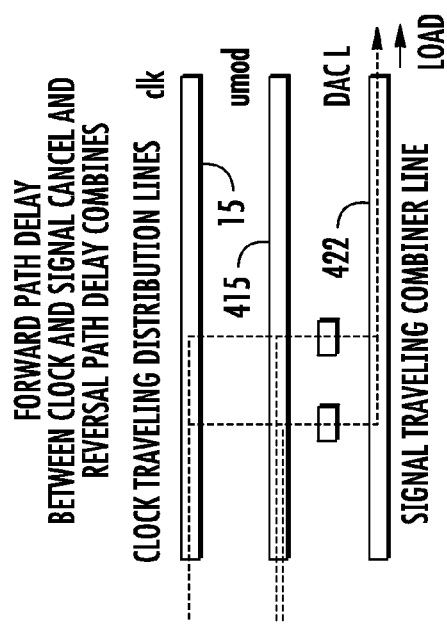
FIGS. 12c and 12d are plots of resulting forward and reverse path frequency spectra, respectively, illustrating the use clock and DAC transmission line delays to enable a shift in center frequency of the output load and backward termination transversal bandpass filters that are formed by the transversal DAC, while the higher power desired signal is delivered to the load, lower power noise is burned in the termination.
Figure 12D:
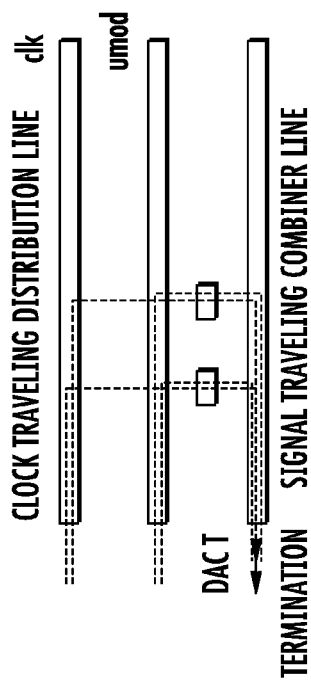

FIG. 12a is a representation of the set the set of parallel transmission lines 15, 415, and 422 (FIG. 4a) carrying the clocks for the shift register, the Umod clocks, and the DAC combining line, respectively. The paths of the forward wave output to the load are shown in FIG. 1a. Two diagrams of the two clock lines and the DAC combining line are shown, where the dashed lines represent the critical propagation path for clock- and signal-affecting timing of output signals. The portion of the dashed line in the top two lines are due to clock delay and the bottom linear are due to the DAC combining delay. In FIG. 12a, the forward wave is shown with two adjacent taps and critical paths. The path lengths for both taps are equal. Hence the analog delays are equal. Also in FIG. 12c, the backward wave is shown for the same two adjacent taps. The delay paths are not equal, and hence analog delay sources contribute to the total transversal delay toward the back termination. The spectrum 1230 of the forward-path signals of FIG. 12a, as seen at the load, is illustrated in FIG. 12b, plotted as dB versus frequency in units of GHz. The inband tone signal is indicated as 1232. The reverse wave output paths are shown in FIG. 12c. The reverse wave output arising from signal flow in the paths of FIG. 12c is shown as a plot 1260 in FIG. 12d. While the inband tone signal 1232 is generated or enhanced at the load, it is suppressed in the back termination. The noise signal 1262 in the bandpass of the termination filter accounts for 10% to 30% of the RF power generated. Given that a sigma-delta ($\Sigma\Delta$) pattern null (not shown) can be placed at the location of the noise signal 1262, the power can be reduced further, about to the 5% level.

Figure 13:
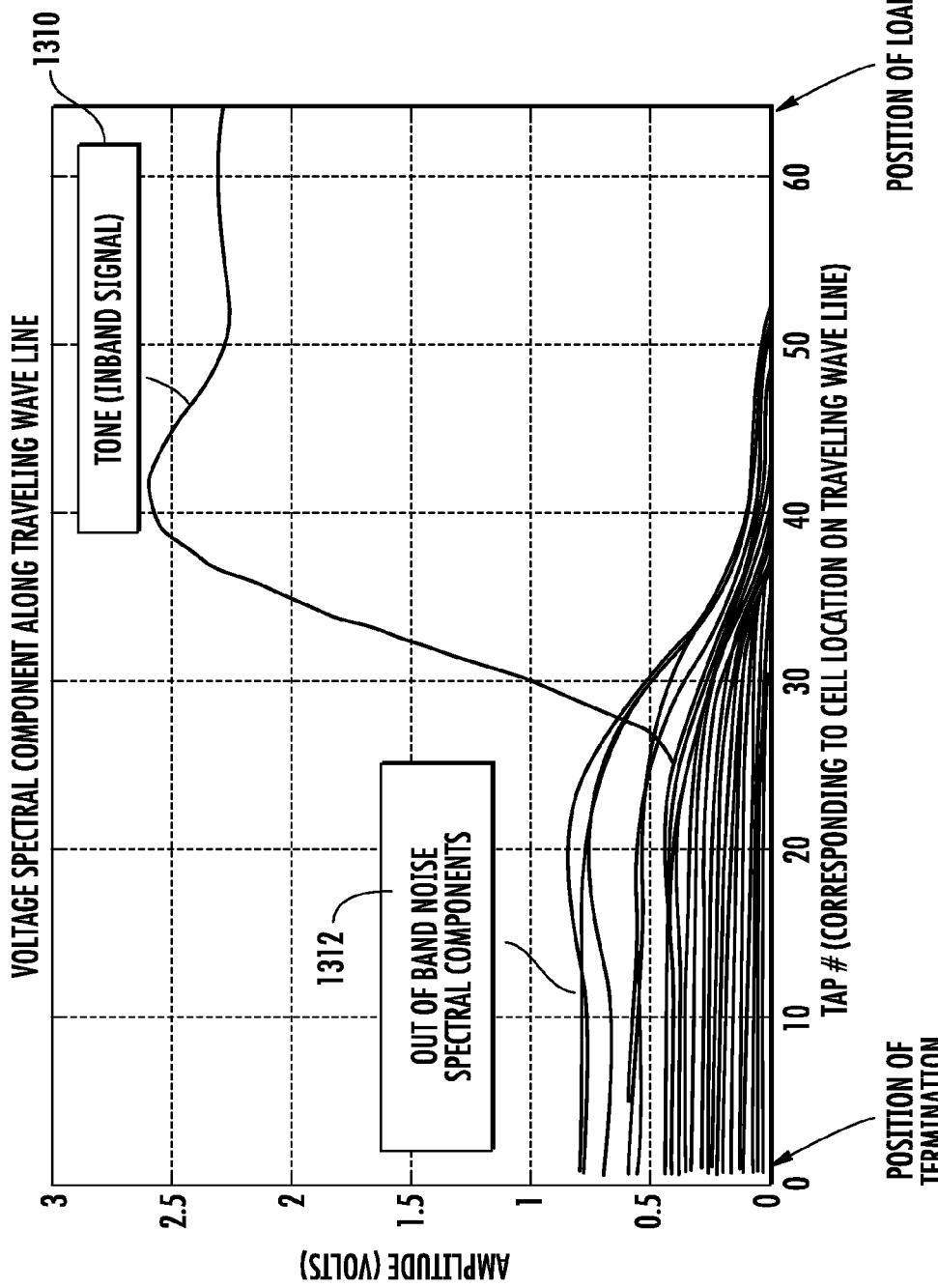
FIG. 13 illustrates plots of inband and out-of-band voltage spectral components propagating in a tapped transmission line, as a function of tap number.

FIG. 13 plots voltage magnitude along the position index of the summing transmission line. Plot 1310 represents the voltage amplitude of the inband-frequency tone signal. It can be seen that the amplitude of the inband tone signal 1310 generally increases with progress toward the load (to the right in FIG. 13). The other, parametric plots of out-of-frequency-band noise components decrease in voltage with progress toward the load, and generally increase toward the back termination. The frequency plot corresponding to the tone signal accumulates in the direction of the load, while the noise signals in the pass band of the termination filter are shown to accumulate in the direction of the termination.

FIGS. 14a, 14b, and 14c illustrate the influence on the output spectrum of the weighting of a 64-tap transversal filter. FIG. 14a plots the tap weight or coefficient as a function of the tap number along the filter, FIG. 14b plots the normalized frequency response of the filter with the weighting of FIG. 14a, and FIG. 14c plots the normalized current amplitude of these coefficients. The center frequency, $f_c$, of a filter can be determined by $$f_c = (k_{co} + M) f_{peff}, \text{ where}$$

$k_{co}$=the normalized center frequency of discrete time filter prototype (between 0 and 0.5 for real valued weights); and M=the umod factor for higher order Nyquist Band (0, 0.5, 1.5, 2, ...)

The periodic frequency is given by $$f_{peff} = \frac{1}{T_s + T_{skew}}, T_{skew} = \Delta\tau_{clk} \pm \tau_p$$

which represents the mean clock and DAC transmission line delays. The center frequencies for the load and termination filters are given by $$f_{cF} = f_o = (k_{co} + M) f_s \text{ for forward wave, } T_{skew} = 0$$

$$f_{cB} = f_o - f_{BW} = (k_{co} + M) f_{peff} \text{ for backward wave}$$

It is useful to define the required value of $T_{skew}$ to enable the termination filter to shift its center frequency by one filter bandwidth, $f_{BW}$. This value of $T_{skew}$ ensures that sufficient delay is used. The value of $T_{skew}$ is given by $$T_{skew} = \frac{k_{co} + M}{f_o - f_{BW}} - T_s$$

For a desired center frequency fo=13 GHz, kco=0.33, M=1, and fs=10 GHz can be used. This is within the third Nyquist band, or the upper side band image with a Umod clock of 10 GHZ. To shift the band downward by 400 MHz requires Tskew=1.33/(fo−400e6)−100 psec=3.1 picoseconds (psec). For lower frequencies, more delay is required for the same frequency shift. One can employ narrower instantaneous pass bands or longer transmission lines at lower frequencies of operation.

The output RF power $P_{RF}(\omega)$ is determined by coherent current gain across the load impedance, and the equation for this determination is set forth in FIG. 15a. In one embodiment employing 64 taps and typical bandpass filter weighting, the output RF power is 100 times the peak single cell power, or 10 times the single cell current.

The total Direct-Current (DC) input power $P_{DCin}$ is the total bias voltage multiplied by the requisite current, determined by the equation set forth in FIG. 15b. In the embodiment above employing 64 taps, the requisite power or current in the array is about 15 times the peak current occurring in the highest-current cell of the array.

FIG. 16a plots the spectrum of the input sigma delta modulated ternary signal, with a relatively high (−45 dB) noise level except in the desired frequency band. Within the desired frequency band of about 2200 to 2600 GHz, the noise is suppressed by about an additional 25 dB. The desired output tone is designated 1632. FIG. 16b is a frequency response plot or spectrum illustrating the transversal DAC output signal produced by a 32 tap array. This plot includes the transfer function of the transversal DAC filter where the digital controlled weights are selected to produce a bandpass filter corresponding to the sigma delta pass band.

An apparatus (10) according to an aspect of the invention is for generating radio-frequency signals ($y_{dac}(t)$) directly from digital signals (x(n)) representing the instantaneous amplitude of the desired radio-frequency signals ($y_{dac}(t)$). The apparatus (10) comprises a sigma-delta encoder (14) coupled to receive the digital signals (x(n)), for generating sigma-delta encoded digital signals (y(n)), and a tapped digital shift register (410) including an input port (15) coupled to receive the sigma-delta encoded digital signals (y(n)). The tapped digital shift register (410) also includes a plurality of output ports (412) at which delayed digital signals appear. A set (420) of DAC cells is provided. Each cell of the set (420) of DAC cells is coupled for receiving one of the delayed digital signals from the tapped digital shift register, for converting the corresponding tapped digital signal into a current. The set (420) of DAC cells therefore produces or generates a set of currents. Weighting means (418, 430) are coupled to the set (420) of DAC cells, for weighting the individual currents of the set of currents (weight 450) so that the radio frequency signals are reconstructed within a finite passband. Combining means (422) are coupled to the set (420) of DAC cells, for combining the set of weighted currents into a combined current representing reconstructed signal. The reconstructed signal is accompanied by aliasing. In one advantageous embodiment, filtering means (428) are coupled to receive the combined current for reducing the aliasing. This filtering may be accomplished with the aid of an impedance transformation which enables higher output voltage in support of high power applications.

A method according to another aspect of the invention is for generating radio-frequency signals ($y_{dac}(t)$) from first digital signals (x(t)) which represent the instantaneous amplitude of the desired radio-frequency signals ($y_{dac}(t)$). The method comprises the steps of encoding the first digital signals with Sigma-Delta encoding (14) to thereby produce Sigma-Delta encoded signals (y(n)), and delaying the bits (410) of the Sigma-Delta encoded signals to thereby produce a plurality of differently delayed bits. The delayed bits are converted (420) into a plurality of currents constituting a set of currents. The currents of the set are summed (422) to produce the desired radio-frequency signals ($y_{dac}(t)$). In an especially advantageous mode of the method, the individual currents of the set of currents are weighted (418, 430) according to predetermined amplitude (450) and sign. Also the transversal delays produce additional phase factors which are incrementally determined for each tap. In each tap an incremental delay includes the delay of the shift register, which is equal to a sample clock period Ts, the clock transmission line delay $\Delta\tau_{clk}$, and the DAC combining line delay $\tau_p$. The combined effect along the row to taps is to represent both a coefficient of a forward filter and simultaneously a different, delay shifted, coefficient of a reverse filter. In a desired filter seen at the intended load, such as that of an antenna. In an especially advantageous mode of the invention, the weights are selected to represent a pass band corresponding to the desired signal at the load, including effects of said delays, and that the clock delay $\Delta\tau_{clk}$ and DAC combiner delay $\tau_p$ will cause a shift the center frequency of the pass band at the back termination port sufficiently to cause the desired signal to be in the stop band of the second filter, thus improving overall power efficiency. In another advantageous mode of this method, the step of delaying the bits (410) of the Sigma-Delta encoded signals comprises the step of applying the bits of the Sigma-Delta encoded signals to a serial shift register ($410_1$, $410_2, \ldots, 410_N$), which may be a clocked serial shift register ($410_1, 410_2, \ldots, 410_N$). When the delayed digital signals are ternary, the registers are two-bit registers.

What is claimed is:

1. An apparatus for generating radio-frequency signals directly from digital signals representing the instantaneous amplitude of the desired radio-frequency signals, said apparatus comprising:
    a sigma-delta encoder coupled to receive said digital signals, for generating sigma-delta encoded digital signals;
    a tapped digital shift register including an input port coupled to receive said sigma-delta encoded digital signals and also including a plurality of output ports at which delayed digital signals appear;
    a set of DAC cells, each cell of said set of DAC cells being coupled for receiving one of said delayed digital signals from said tapped digital shift register, for converting the corresponding tapped digital signal into a current, thereby generating a set of currents;
    a combiner coupled to said set of DAC cells, for combining said set of currents into a combined current representing reconstructed signal, said combiner comprising a first transmission line for receiving said set of currents, and at least a second transmission line having similar phase progression for delaying clock signals applied to said tapped digital shift register; and
    a set of static digital drivers and a set of digital control sources are coupled to said set of DAC cells, for weighting the individual currents of said set of currents so that said radio frequency signals are reconstructed within a finite passband.

2. An apparatus according to claim 1, wherein said combiner coupled to said set of DAC cells, for combining said set of currents into a combined current representing reconstructed signal, combines said set of currents into a combined current representing reconstructed signal with aliasing; and further comprising:
    a filter coupled to receive said combined current with aliasing for reducing said aliasing.

3. An apparatus according to claim 1, wherein:
    said first transmission line defines a back port and a forward port at which said reconstructed signal with aliasing is generated; and further comprising
    a filter coupled to at least one of said back and forward ports for reducing frequency components lying outside a desired Nyquist band.

4. An apparatus according to claim 3, further comprising an impedance transformer cascaded with said filter for matching power flow from said transmission line to a load.

5. An apparatus according to claim 4 wherein said filter is coupled to said forward port, and said load comprises a radiator antenna.

6. An apparatus according to claim 4 wherein said filter is coupled to said back port, and said load comprises a back termination.

7. An apparatus according to claim 1, wherein:
    said first transmission line defines a back port and a forward port at which said reconstructed signal with aliasing is generated; and
    further comprising a filter coupled to at least one of said back and forward ports for passing frequency components within a desired Nyquist band.

8. An apparatus according to claim 1, wherein:
    said first transmission line defines a back port and a forward port at which said reconstructed signal with aliasing is generated; and
    further comprising a filter coupled to at least one of said back and forward ports for reducing frequency components outside a desired Nyquist band and for passing frequency components within said desired Nyquist band.

9. An apparatus according to claim 1 wherein said first transmission line defines portions with relatively higher and relatively lower characteristic impedance, and said portions with relatively higher characteristic impedance receive said currents of said set of currents.

10. An apparatus according to claim 1, wherein each of said currents is generated by a DAC cell of a set of DAC cells, and said first transmission line is disposed with the parasitic capacitance of the DAC cells incorporated into the distributed characteristics of said first transmission line.

11. A method for generating radio-frequency signals from first digital signals which represent the instantaneous amplitude of the desired radio-frequency signals, said method comprising the steps of:
    encoding said first digital signals with Sigma-Delta encoding to thereby produce Sigma-Delta encoded signals;
    delaying the bits of said Sigma-Delta encoded signals to thereby produce a plurality of differently delayed bits;
    converting said plurality of differently delayed bits into a plurality of currents constituting a set of currents;
    providing a combiner comprising a first transmission line for receiving said set of currents, and at least a second transmission line having similar phase progression for delaying clock signals associated with said delaying step;
    summing said currents of said set of currents using said combiner to produce said radio-frequency signals; and
    weighting said plurality of currents of said set of currents according to predetermined amplitude and phase representing a coefficient of a filter.

12. A method according to claim 11, wherein said step of delaying the bits of said Sigma-Delta encoded signals comprises the step of:
    applying said bits of said Sigma-Delta encoded signals to a serial shift register.

13. A method according to claim 11, wherein said step of weighting said plurality of currents comprises the steps of:
    weighting said currents with a pattern corresponding to a filter response.

14. A method according to claim 11, wherein said step of summing said currents of said set of currents comprises the step of applying said currents to input ports of a the first transmission line.

15. A method according to claim 14, wherein said step of applying said currents includes the step of phase delaying said currents in accordance with the phase progression of signals traversing said first transmission line.

16. A method for generating radio-frequency electrical signals from digital signals representing the instantaneous amplitude of the desired radio-frequency signals, said method comprising the steps of:
    converting said digital signals representing the instantaneous amplitude of the desired radio-frequency signals into sigma-delta encoded digital signals;

delaying said sigma-delta encoded digital signals by different amounts to a produce a plurality of variously delayed digital signals;

converting each of said variously delayed digital signals into corresponding analog signals;

providing a combiner comprising a first transmission line for receiving said analog signals, and at least a second transmission line having similar phase progression for delaying clock signals associated with said delaying step; and combining said analog signals with said combiner to produce the desired radio-frequency signals.

17. A method according to claim 16, wherein said combining step is performed by distributed summing.

18. A method according to claim 17, wherein said step of distributed summing includes application of each of said corresponding analog signals to a separate input port of a distributed summing circuit.

19. A method according to claim 17, wherein said step of distributed summing includes application of each of said corresponding analog signals to a separate input port of a the first transmission line.

20. A method according to claim 16, further comprising the step of weighting said corresponding analog signals so that said radio frequency signals are reconstructed within a finite passband.

21. A method according to claim 16, wherein said step of converting each of said variously delayed digital signals into corresponding analog signals includes the step of converting each of said variously delayed digital signals into corresponding analog currents; and said step of combining said analog signals to produce the desired radio-frequency signals includes the step of distributed summing.

22. A method according to claim 21, wherein said step of distributed summing includes application of each of said corresponding analog currents to a separate input port of the first transmission line.

* * * * *

UNITED STATES PATENT AND TRADEMARK OFFICE
CERTIFICATE OF CORRECTION

PATENT NO.        : 7,504,976 B1                                    Page 1 of 1
APPLICATION NO. : 11/700382
DATED             : March 17, 2009
INVENTOR(S)       : Leopold E. Pellon It is certified that error appears in the above-identified patent and that said Letters Patent is hereby corrected as shown below:

In column 1, beginning on line 4 directly below the title and above the section heading "FIELD OF THE INVENTION", please insert the following:

--STATEMENT OF GOVERNMENTAL INTEREST

This invention was made with Government Support under Contract No. N00014-02-C-0170 awarded by the Department of the Navy. The Government has certain rights in this invention.--

Signed and Sealed this

Fifth Day of May, 2009

JOHN DOLL
*Acting Director of the United States Patent and Trademark Office*